US012685159B2

(12) United States Patent
Ramakrishnan et al.

(10) Patent No.: US 12,685,159 B2
(45) Date of Patent: Jul. 14, 2026

(54) 3D INTEGRATED CHIPS WITH MICROFLUIDIC COOLING

(71) Applicant: Microsoft Technology Licensing, LLC, Redmond, WA (US)

(72) Inventors: Bharath Ramakrishnan, Bellevue, WA (US); Husam Atallah Alissa, Redmond, WA (US); Eric C. Peterson, Woodinville, WA (US); Christian L Belady, Mercer Island, WA (US); Dennis Trieu, Calgary (CA)

(73) Assignee: Microsoft Technology Licensing, LLC, Redmond, WA (US)

( * ) Notice: Subject to any disclaimer, the term of this patent is extended or adjusted under 35 U.S.C. 154(b) by 929 days.

(21) Appl. No.: 17/725,422

(22) Filed: Apr. 20, 2022

(65) Prior Publication Data

US 2023/0338948 A1     Oct. 26, 2023

(51) Int. Cl.
*H10W 40/40*     (2026.01)
*H10W 40/43*     (2026.01)
*H10W 40/47*     (2026.01)

(52) U.S. Cl.
CPC ........... *H10W 40/40* (2026.01); *H10W 40/43* (2026.01); *H10W 40/47* (2026.01)

(58) Field of Classification Search
CPC ....... H01L 23/44; H01L 23/46; H01L 23/767; H01L 23/473; H01L 2225/1094; H01L 2225/06589; H10W 40/40; H10W 40/43; H10W 40/47
See application file for complete search history.

(56) References Cited

U.S. PATENT DOCUMENTS

| | | | | |
|---|---|---|---|---|
| 5,046,552 A | * | 9/1991 | Tousignant | ............. F28F 3/048 |
| | | | | 257/E23.098 |
| 6,991,024 B2 | | 1/2006 | Goodson | |
| 7,015,572 B2 | * | 3/2006 | Yamaji | .................... H01L 25/50 |
| | | | | 257/E21.705 |
| 7,095,111 B2 | | 8/2006 | Hu | |
| 7,115,987 B2 | * | 10/2006 | Holalkere | ............. H01L 23/473 |
| | | | | 257/713 |
| 7,432,592 B2 | * | 10/2008 | Shi | .......................... H01L 25/18 |
| | | | | 257/E23.098 |
| 7,755,186 B2 | | 7/2010 | Chiu | |

(Continued)

FOREIGN PATENT DOCUMENTS

| | | | |
|---|---|---|---|
| CN | 203983270 U | 12/2014 | |
| CN | 104112736 B | 9/2017 | |

(Continued)

OTHER PUBLICATIONS

Non-Final Office Action mailed on Jan. 29, 2024, in U.S. Appl. No. 17/725,420, 11 pages.

(Continued)

*Primary Examiner* — David A Zarneke
(74) *Attorney, Agent, or Firm* — Ray Quinney & Nebeker P.C.; Paul N. Taylor

(57)     ABSTRACT

A processor includes a first die, a second die connected to the first die with a microfluidic volume positioned between the first die and the second die, at least one pin fin positioned in the microfluidic volume, and a boiling enhancement surface feature positioned on a pin surface of the pin fin.

19 Claims, 10 Drawing Sheets

(56)                References Cited

U.S. PATENT DOCUMENTS

| | | | | |
|---|---|---|---|---|
| 7,990,711 | B1 * | 8/2011 | Andry | H01L 25/0657 165/80.4 |
| 8,333,235 | B2 | 12/2012 | Chang | |
| 8,363,402 | B2 * | 1/2013 | Brunschwiler | H01L 23/473 361/698 |
| 8,546,930 | B2 | 10/2013 | Bakir et al. | |
| 8,659,898 | B2 * | 2/2014 | Brunschwiler | H01L 25/0657 361/698 |
| 8,953,314 | B1 * | 2/2015 | Fedorov | H01L 23/473 361/677 |
| 9,009,971 | B2 | 4/2015 | Campbell | |
| 9,095,942 | B2 | 8/2015 | Campbell | |
| 9,484,328 | B2 | 11/2016 | Luo | |
| 9,625,186 | B2 | 4/2017 | Chou et al. | |
| 9,648,730 | B2 * | 5/2017 | Harvilchuck | H05K 7/20154 |
| 9,679,827 | B2 * | 6/2017 | Vishkin | H01L 23/473 |
| 9,711,433 | B2 | 7/2017 | Taniguchi | |
| 9,847,275 | B2 * | 12/2017 | Chainer | H01L 23/427 |
| 9,997,434 | B2 | 6/2018 | Kumari | |
| 10,177,116 | B2 * | 1/2019 | Andry | H01L 23/473 |
| 10,504,819 | B2 * | 12/2019 | Gutala | H01L 25/0657 |
| 10,739,830 | B2 | 8/2020 | Lee | |
| 10,838,287 | B2 | 11/2020 | Shimizu | |
| 10,948,241 | B2 | 3/2021 | Joshi | |
| 10,957,624 | B2 | 3/2021 | Chen et al. | |
| 11,073,340 | B2 | 7/2021 | Kandlikar | |
| 11,150,030 | B2 | 10/2021 | Kishimoto | |
| 11,337,336 | B2 | 5/2022 | Aoki | |
| 11,346,617 | B2 | 5/2022 | Kaibuchi | |
| 11,456,231 | B2 * | 9/2022 | Zhong | H01L 23/4006 |
| 11,581,257 | B2 * | 2/2023 | Lee | H01L 24/08 |
| 11,915,996 | B2 * | 2/2024 | Sankman | H01L 23/367 |
| 2004/0188829 | A1 | 9/2004 | Hu | |
| 2005/0280128 | A1 | 12/2005 | Mok et al. | |
| 2007/0121299 | A1 * | 5/2007 | Campbell | H01L 23/4735 257/E23.098 |
| 2010/0018678 | A1 | 1/2010 | Siu | |
| 2010/0187683 | A1 | 7/2010 | Bakir et al. | |
| 2015/0257307 | A1 * | 9/2015 | Mitsui | H05K 7/20418 165/185 |
| 2016/0056089 | A1 | 2/2016 | Taniguchi et al. | |
| 2017/0084514 | A1 | 3/2017 | Kumari et al. | |
| 2017/0133298 | A1 | 5/2017 | Gutala | |
| 2017/0323843 | A1 * | 11/2017 | Ganguly | H10D 88/00 |
| 2020/0105643 | A1 * | 4/2020 | Wan | H01L 25/18 |
| 2020/0132392 | A1 * | 4/2020 | Joshi | H05K 7/2039 |
| 2020/0402889 | A1 | 12/2020 | Bonam et al. | |
| 2021/0118854 | A1 | 4/2021 | Sikka et al. | |
| 2023/0317548 | A1 | 10/2023 | Hazra | |
| 2023/0341910 | A1 | 10/2023 | Ramakrishnan | |
| 2023/0343670 | A1 * | 10/2023 | Lee | H01L 23/367 |
| 2023/0345673 | A1 | 10/2023 | Trieu | |

FOREIGN PATENT DOCUMENTS

| | | |
|---|---|---|
| CN | 108766897 B | 5/2020 |
| CN | 113035808 A | 6/2021 |
| CN | 113257757 A | 8/2021 |
| CN | 113543600 A | 10/2021 |
| EP | 3168869 A1 | 5/2017 |
| EP | 4187591 A1 * | 5/2023 .......... H01L 23/367 |
| FR | 2964791 A1 | 3/2012 |
| WO | 2021263037 A1 | 12/2021 |

OTHER PUBLICATIONS

Deng, et al., "A Review on Flow Boiling Enhancement and Fabrication of Enhanced Microchannels of Microchannel Heat Sinks", In International Journal of Heat and Mass Transfer, vol. 175, May 11, 2021, pp. 1-41.

Feng, et al., "Thermal Management Of 3D Chip With Non-Uniform Hotspots By Integrated Gradient Distribution Annular-Cavity Micro-Pin Fins", In Journal of Applied Thermal Engineering, vol. 182, Oct. 2, 2020, pp. 1-15.

Oh, et al., "High-Aspect Ratio Through-Silicon Vias for the Integration of Microfluidic Cooling with 3D Microsystems", In Journal of Microelectronic Engineering, vol. 142, Jul. 29, 2015, pp. 30-35.

"International Search Report and Written Opinion Issued in PCT Application No. PCT/US23/014189", Mailed Date: Jun. 19, 2023, 12 Pages.

"International Search Report and Written Opinion Issued in PCT Application No. PCT/US23/015252", Mailed Date: Jun. 27, 2023, 12 Pages.

"International Search Report and Written Opinion Issued in PCT Application No. PCT/US23/015332", Mailed Date: Jun. 16, 2023, 10 Pages.

Notice of Allowance mailed on Aug. 21, 2024, in U.S. Appl. No. 17/725,428, 08 pages.

Non-Final Office Action mailed on Apr. 9, 2024, in U.S. Appl. No. 17/725,428, 16 pages.

Notice of Allowance mailed on Jun. 7, 2024, in U.S. Appl. No. 17/725,420, 8 pages.

Jung, et al., "Thermal Design and Management of Micro-Pin Fin Heat Sinks for Energy-Efficient Three-Dimensional Stacked Integrated Circuits", In International Journal of Heat and Mass Transfer, vol. 175, Aug. 2021, 14 Pages.

Zhang, et al., "Silicon Micropin-Fin Heat Sink with Integrated TSVs for 3-D ICs: Tradeoff Analysis and Experimental Testing", In IEEE Transactions on Components, Packaging and Manufacturing Technology, vol. 3, Issue 11, Nov. 2013, pp. 1842-1850.

Ramakrishnan, et al., "CPU Overlocking: A Performance Assessment of Air, Cold Plate and Two-Phase Immersion Cooling", In IEEE Transactions on Components, Packaging and Manufacturing Technology, vol. 11, Issue 10, Oct. 2021, pp. 1703-1715.

Sekar, et al., "A 3D-IC Technology with Integrated Microchannel Cooling", In International Interconnect Technology Conference, Jun. 1, 2008, pp. 13-15.

Wan, et al., "Co-Design of Multicore Architectures and Microfluidic Cooling for 3D Stacked ICs", In Proceedings of 19th International Workshop on Thermal Investigations of ICs and Systems (THERMINIC), Sep. 25, 2013, pp. 237-242.

Zhang, et al., "3D Stacked Microfluidic Cooling for High-Performance 3D ICs", In Proceedings of IEEE 62nd Electronic Components and Technology Conference, May 29, 2012, pp. 1644-1650.

Oh, et al., "Electrical Interconnect and Microfluidic Cooling within 3D ICs and Silicon Interposer", In Proceedings of the ASME 12th International Conference on Nanochannels, Microchannels, and Minichannels, Aug. 3, 2014, 7 Pages.

* cited by examiner

3D INTEGRATED CHIPS WITH MICROFLUIDIC COOLING

BACKGROUND

Background and Relevant Art

Computing devices can generate a large amount of heat during use. The computing components can be susceptible to damage from the heat and commonly require cooling systems to maintain the component temperatures in a safe range during heavy processing or usage loads. Different computing demands and applications produce different amounts of thermal energy and require different amounts of thermal management.

BRIEF SUMMARY

In some embodiments, a processor includes a first die, a second die connected to the first die with a microfluidic volume positioned between the first die and the second die, at least one pin fin positioned in the microfluidic volume, and a boiling enhancement surface feature positioned on a pin surface of the pin fin.

In some embodiments, a processor includes a first die, a second die connected to the first die with a microfluidic volume positioned between the first die and the second die, at least one pin fin positioned in the microfluidic volume, at least one through-silicon via (TSV) in the pin fin providing electrical connection between the first die and the second die, and a boiling enhancement coating positioned on a pin surface of the pin fin.

In some embodiments, a system for cooling heat-generating components includes a first die, a second die connected to the first die with a microfluidic volume positioned between the first die and the second die, at least one pin fin positioned in the microfluidic volume, at least one through-silicon via (TSV) in the pin fin providing electrical connection between the first die and the second die, a boiling enhancement surface feature positioned on a pin surface of the pin fin, and a fluid pump configured to deliver a working fluid to the microfluidic volume.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which.

DETAILED DESCRIPTION

Figure 1:
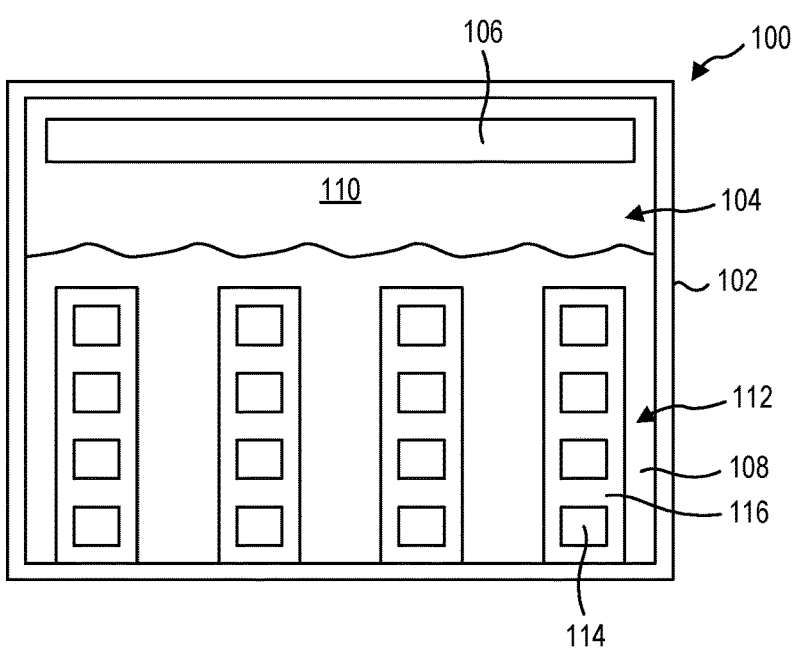
FIG. 1 is a side schematic representation of an immersion cooling system, according to at least one embodiment of the present disclosure.

The present disclosure relates generally to systems and methods for thermal management of electronic devices or other heat-generating components. In some embodiments, heat spreaders and wicking structures according to the present disclosure promote the boiling and vapor bubble formation and/or release during vaporization of working fluid.

Immersion chambers surround the heat-generating components in a liquid working fluid, which conducts heat from the heat-generating components to cool the heat-generating components. As the working fluid absorbs heat from the heat-generating components, the temperature of the working fluid increases. In some embodiments, the hot working fluid can be circulated through the thermal management system to cool the working fluid and/or replace the working fluid with cool working fluid. In some embodiments, the working fluid vaporizes, introducing vapor into the liquid of the working fluid which rises out of the liquid phase, carrying thermal energy away from the heat-generating components in the gas phase via the latent heat of boiling.

In large-scale computing centers, such as cloud-computing centers, data processing centers, data storage centers, or other computing facilities, immersion cooling systems provide an efficient method of thermal management for many computing components under a variety of operating loads. In some embodiments, an immersion cooling system includes a working fluid in an immersion chamber and a heat exchanger to cool the liquid phase and/or a condenser to extract heat from the vapor phase of the working fluid. The heat exchanger may include a condenser that condenses the vapor phase of the working fluid into a liquid phase and returns the liquid working fluid to the immersion chamber. In some embodiments, the liquid working fluid absorbs heat from the heat-generating components, and one or more fluid conduits direct the hot liquid working fluid outside of the immersion chamber to a radiator, heat exchanger, or region of lower temperature to cool the liquid working fluid.

In some embodiments, a high-compute application assigned to and/or executed on the computing devices or systems in the immersion cooling system requires a large amount of thermal management. A working fluid boiling absorbs heat to overcome the latent heat of boiling. The phase change from liquid to vapor, therefore, allows the working fluid to absorb a comparatively large amount of heat with a small associated increase in temperature. Further, the lower density allows the vapor to be removed from the immersion bath efficiently to exhaust the associated heat from the system.

In some embodiments, a thermal management system includes an immersion tank with a two-phase working fluid positioned therein. The two-phase working fluid receives heat from heat-generating components immersed in the liquid working fluid, and the heat vaporizes the working fluid, changing the working fluid from a liquid phase to a vapor phase. The thermal management system includes a condenser, such as described herein, to condense the vapor working fluid back into the liquid phase. In some embodiments, the condenser is in fluid communication with the immersion tank by one or more conduits. In some embodiments, the condenser is positioned inside the immersion tank.

A conventional immersion cooling system 100, shown in FIG. 1, includes an immersion tank 102 containing an immersion chamber 104 and a condenser 106 in the immersion chamber 104. The immersion chamber 104 contains an immersion working fluid that has a liquid working fluid 108 and a vapor working fluid 110 portion. The liquid working fluid 108 creates an immersion bath 112 in which a plurality of heat-generating components 114 are positioned to heat the liquid working fluid 108 on supports 116.

Figure 2:
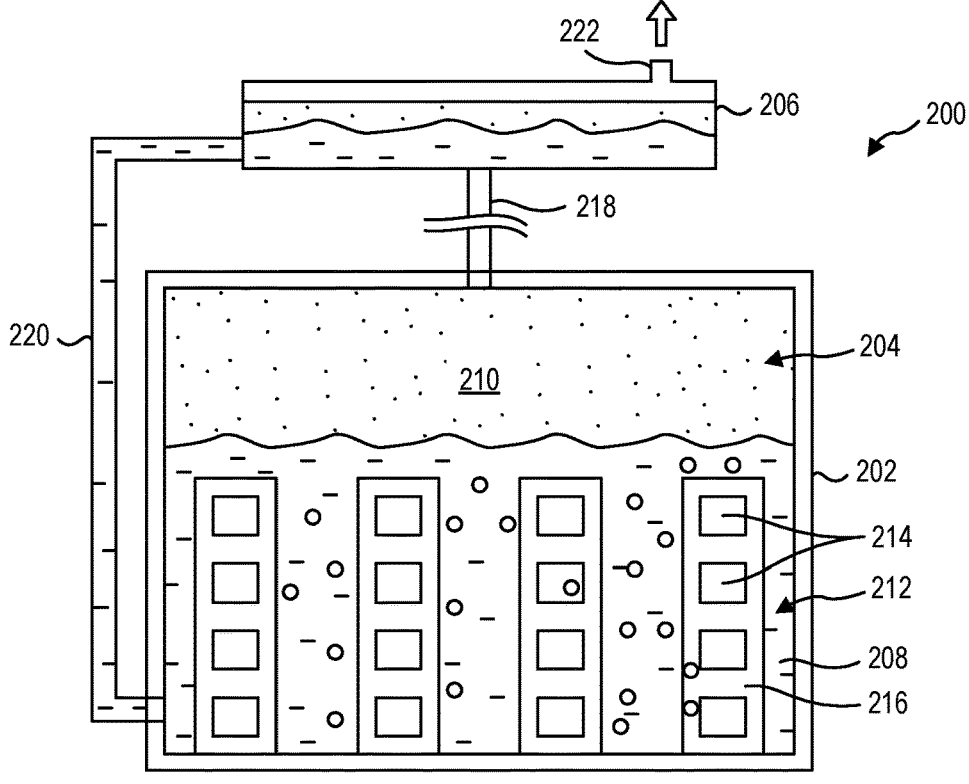
FIG. 2 is a side schematic representation of an immersion cooling system with an external condenser, according to at least one embodiment of the present disclosure.

Referring now to FIG. 2, in some embodiments, an immersion cooling system 200 includes an immersion tank 202 defining an immersion chamber 204 with an immersion working fluid positioned therein. An immersion working fluid in the immersion tank 202 has a boiling temperature that is at least partially related to one or more operating properties of the immersion cooling system, the electronic components and/or computing devices in the immersion tank 202, computational or workloads of the electronic components and/or computing devices in the immersion tank 202, external and/or environmental conditions, or other properties that affect the operation of the immersion cooling system 200. As the operating conditions of the immersion cooling system 200 change, the immersion cooling system 200 can change a mixing ratio of the immersion working fluid to change at least one property (such as boiling temperature) of the immersion working fluid.

In some embodiments, the immersion working fluid transitions between a liquid working fluid 208 phase and a vapor working fluid 210 phase to remove heat from hot or heat-generating components 214 in the immersion chamber 204. The liquid working fluid 208 more efficiency receives heat from the heat-generating components 214 and, upon transition to the vapor working fluid 210, the vapor working fluid 210 can be removed from the immersion tank 202, cooled and condensed by the condenser 206 (or other heat exchanger) to extract the heat from the working fluid, and the liquid working fluid 208 can be returned to the liquid immersion bath 212.

In some embodiments, the immersion bath 212 of the liquid working fluid 208 has a plurality of heat-generating components 214 positioned in the liquid working fluid 208. The liquid working fluid 208 surrounds at least a portion of the heat-generating components 214 and other objects or parts attached to the heat-generating components 214. In some embodiments, the heat-generating components 214 are positioned in the liquid working fluid 208 on one or more supports 216. The support 216 may support one or more heat-generating components 214 in the liquid working fluid 208 and allow the working fluid to move around the heat-generating components 214. In some embodiments, the support 216 is thermally conductive to conduct heat from the heat-generating components 214. The support(s) 216 may increase the effective surface area from which the liquid working fluid 208 may remove heat through convective cooling.

In some embodiments, the heat-generating components 214 include electronic or computing components or power supplies. In some embodiments, the heat-generating components 214 include computer devices, such as individual personal computer or server blade computers. In some embodiments, one or more of the heat-generating components 214 includes a heat sink or other device attached to the heat-generating component 214 to conduct away thermal energy and effectively increase the surface area of the heat-generating component 214. In some embodiments, the heat sink of the heat-generating component 214 is a vapor chamber with one or more three-dimensional structures to increase surface area.

As described, conversion of the liquid working fluid 208 to a vapor phase requires the input of thermal energy to overcome the latent heat of vaporization and may be an effective mechanism to increase the thermal capacity of the working fluid and remove heat from the heat-generating components 214. Because the vapor working fluid 210 rises in the liquid working fluid 208, the vapor working fluid 210 can be extracted from the immersion chamber 204 in an upper vapor region of the chamber. A condenser 206 cools part of the vapor working fluid 210 back into a liquid working fluid 208, removing thermal energy from the system and reintroducing the working fluid into the immersion bath 212 of the liquid working fluid 208. The condenser 206 radiates or otherwise dumps the thermal energy from the working fluid into the ambient environment or into a conduit to carry the thermal energy away from the cooling system.

In some embodiments of immersion cooling systems, a liquid-cooled condenser is integrated into the immersion tank and/or the chamber to efficiency remove the thermal energy from the working fluid. In some embodiments, an immersion cooling system 200 for thermal management of computing devices allows at least one immersion tank 202 and/or chamber 204 to be connected to and in fluid communication with an external condenser 206. In some embodiments, an immersion cooling system 200 includes a vapor return line 218 that connects the immersion tank 202 to the condenser 206 and allows vapor working fluid 210 to enter the condenser 206 from the immersion tank 202 and/or chamber 204 and a liquid return line 220 that connects the immersion tank 202 to the condenser 206 and allows liquid working fluid 208 to return to the immersion tank 202 and/or chamber 204.

The vapor return line 218 may be colder than the boiling temperature of the working fluid. In some embodiments, a portion of the vapor working fluid 210 condenses in the vapor return line 218. The vapor return line 218 can, in some embodiments, be oriented at an angle such that the vapor return line 218 is non-perpendicular to the direction of gravity. The condensed working fluid can then drain either back to the immersion tank 202 or forward to the condenser 206 depending on the direction of the vapor return line 218 slope. In some embodiments, the vapor return line 218 includes a liquid collection line or valve, like a bleeder valve, that allows the collection and/or return of the condensed working fluid to the immersion tank 202 or condenser 206.

In some examples, an immersion cooling system 200 includes an air-cooled condenser 206. An air-cooled condenser 206 may require fans or pumps to force ambient air over one or more heat pipes or fins to conduct heat from the condenser to the air. In some embodiments, the circulation of immersion working fluid through the immersion cooling system 200 causes liquid working fluid 208 to flow past one or more heat-generating components 214. In the example of a heat-generating component 214 with a vapor chamber heat sink, the dynamics of liquid working fluid 208 may be used to move vapor chamber working fluid within the vapor chamber and/or the boiling of the immersion working fluid by the vapor chamber may drive flow of the immersion working fluid.

In some embodiments, the liquid working fluid receives heat in a cooling volume of working fluid immediately surrounding the heat-generating components. The cooling volume is the region of the working fluid (including both liquid and vapor phases) that is immediately surrounding the heat-generating components and is responsible for the convective cooling of the heat-generating components. In some embodiments, the cooling volume is the volume of working fluid within 5 millimeters (mm) of the heat-generating components.

The immersion working fluid has a boiling temperature below a critical temperature at which the heat-generating components experience thermal damage. The immersion working fluid can thereby receive heat from the heat-generating components to cool the heat-generating components before the heat-generating components experience damage.

For example, the heat-generating components may be computing components that experience damage above 100° Celsius (C). In some embodiments, the boiling temperature of the immersion working fluid is less than a critical temperature of the heat-generating components. In some embodiments, the boiling temperature of the immersion working fluid is less about 90° C. at 1 atmosphere of pressure. In some embodiments, the boiling temperature of the immersion working fluid is less about 80° C. at 1 atmosphere of pressure. In some embodiments, the boiling temperature of the immersion working fluid is less about 70° C. at 1 atmosphere of pressure. In some embodiments, the boiling temperature of the immersion working fluid is less about 60° C. at 1 atmosphere of pressure. In some embodiments, the boiling temperature of the immersion working fluid is at least about 35° C. at 1 atmosphere of pressure. In some embodiments, the working fluid includes water.

In some embodiments, the working fluid includes glycol. In some embodiments, the working fluid includes a combination of water and glycol. In some embodiments, the working fluid includes an aqueous solution. In some embodiments, the working fluid includes an electronic liquid, such as FC-72 available from 3M, or similar non-conductive fluids. In some embodiments, the heat-generating components, supports, or other elements of the immersion cooling system positioned in the working fluid have nucleation sites on a surface thereof that promote the nucleation of vapor bubbles of the working fluid at or below the boiling temperature of the working fluid.

Figure 3:
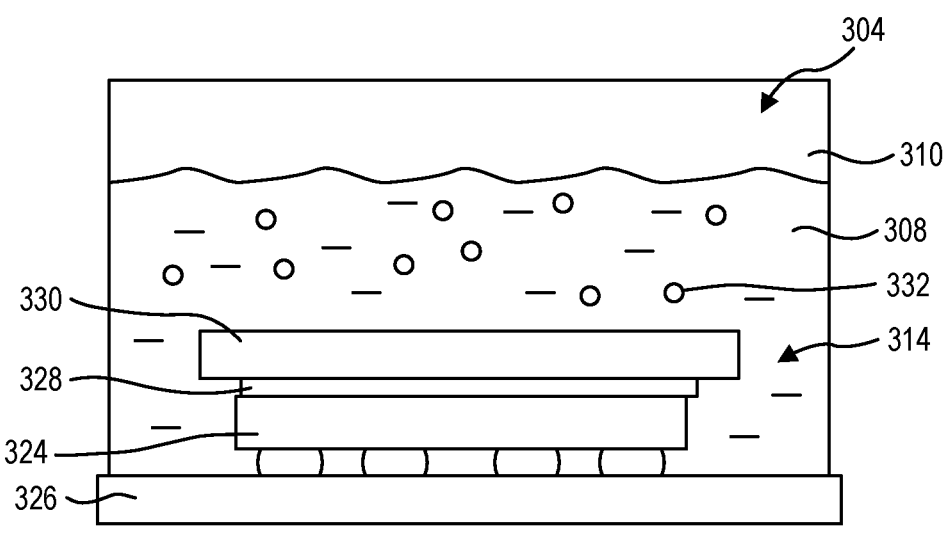
FIG. 3 is a side view of a conventional heat spreader.

FIG. 3 is a side cross-sectional view of an example of a conventional heat spreader. In an example, a heat-generating component 314 includes a die 324 positioned on a printed circuit board (PCB) 326. The die 324 may be a generalized device, such as a central processing unit (CPU) or graphical processing unit (GPU), or a specialized device application-specific integrating circuit (ASIC). The die 324 generates heat during use. The heat is transmitted by a thermal interface material (TIM) 328 to a heat spreader 330 that is in contact with the liquid phase 308 of the working fluid in the immersion chamber 304.

The heat spreader 330 transfers heat to the liquid phase 308 of the working fluid to vaporize the working fluid into a vapor phase 310 of the working fluid. As described herein, the formation of the vapor bubbles 332 allows the working fluid to receive heat to overcome the latent heat of vaporization without substantially increasing the temperature of the working fluid. The vapor bubbles 332 then, through the buoyancy of the vapor phase 310, rise out of the liquid phase 308 of the working fluid, and liquid phase 308 of the working fluid replaces the vapor phase 310 contacting the surface of the heat spreader 330, allowing the process to repeat and continue.

However, the heat transfer of the heat spreader 330 to the liquid phase 308 of the working fluid is limited by the surface area of the heat spreader 330 in contact with the liquid phase 308 of the working fluid. A conventional, solid heat spreader 330 has a limited surface area given the amount of space on the PCB 326 and/or in the immersion chamber 304 relative to other components, devices, or structures immersed in the working fluid. In some embodiments, vapor formation on the surface of the heat spreader 330 further limits the available surface area of the heat spreader 330 in contact with the liquid phase 308 of the working fluid. A heat transfer rate from the heat spreader 330 to the vapor phase 310 of the working fluid is lower than for the heat spreader 330 to the liquid phase 308 of the working fluid. For example, while the vapor bubble 332 remains in contact with a surface of the heat spreader 330, such as due to cohesion, the heat spreader 330 can continue to increase in temperature above the boiling temperature of the working fluid, which may be undesirable for thermal management of the heat-generating component 314 and/or preventing dry-out in the immersion cooling system.

In some embodiments, one or more features that increase surface area and promote bubble formation and release from the heat spreader can improve heat transfer rates from the heat spreader to the working fluid.

Figure 4:
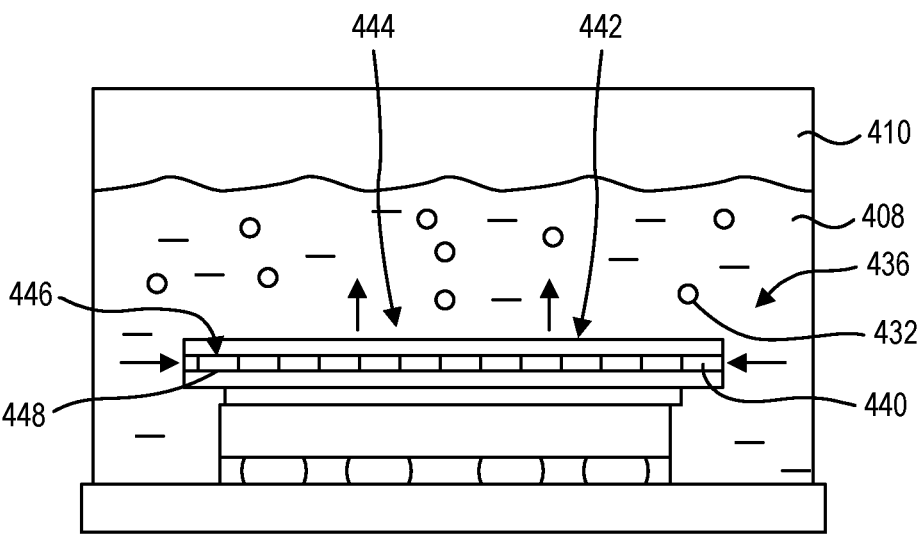
FIG. 4 is a side view of a wicking heat spreader, according to at least one embodiment of the present disclosure.

FIG. 4 is a side cross-sectional view of an embodiment of a thermal management device including a wicking heat spreader 436 according to the present disclosure. In some embodiments, the wicking heat spreader 436 is a three-dimensional heat spreader with a plurality of channels therein or therethrough that allow flow of working fluid through an interior volume 438 of the heat spreader. A three-dimensional heat spreader conducts heat within a plane of the heat spreader that is parallel to a plane of the heat source (such as a surface of a die), as well as in a vertical direction away from the plane. In some embodiments, the wicking heat spreader 436 includes both horizontal channels 440 and vertical channels 442. For example, the horizontal channels 440 may draw a liquid phase 408 of the working fluid into the wicking heat spreader 436 from the sides of the wicking heat spreader 436, while vertical channels 442 allow exhausting of both liquid phase 408 and vapor phase 410 working fluid from the wicking heat spreader 436.

In some embodiments, the vapor bubbles 432 floating out of the channels 440, 442 of the wicking heat spreader 436 contribute to the flow of liquid phase 408 working fluid into the channels 440, 442 of the wicking heat spreader 436. For example, the bubbles 432 vacating the space in the channels 440, 442 of the wicking heat spreader 436 can draw liquid phase 408 working fluid into the channels 440, 442 to replace the volume of the vapor bubbles 432. In some embodiments, the fluidic drag of the vapor bubbles 432 moving through the liquid phase 408 working fluid can drag the liquid phase 408 in the direction of movement of the vapor bubbles 432, which may move hot liquid phase 408 working fluid out of the wicking heat spreader 436 and encourage cool liquid phase 408 working fluid to enter the wicking heat spreader 436.

It should be understood that while some embodiments of a wicking heat spreader are described with horizontal and vertical channels, the wicking heat spreader may be oriented in any direction relative to gravity. The embodiments described herein will describe the horizontal channels as being oriented substantially parallel to a plane of a surface of the die and vertical channels as being oriented substantially perpendicular to the plane of a surface of the die, but the channels may have other orientations, as well, as will be described in greater detail herein.

In some embodiments, a wicking heat spreader 436 has an outer surface 444. The outer surface has openings therein to allow ingress and egress of working fluid to an interior volume 446 of the wicking heat spreader 436. The wicking heat spreader 436 has at least one horizontal channel 440 and at least one vertical channel 442 with interior surfaces 448 that are oriented toward the interior volume 446 (e.g., toward the channels 440, 442) and away from the outer surface 444 of the wicking heat spreader 436. The interior surfaces 448 and outer surfaces 444 of the wicking heat spreader 436 increase the surface area of the wicking heat spreader 436 relative to a conventional heat spreader with a continuous outer surface and no working fluid flow through the frame of the heat spreader. Increased surface area relative to volume allows for greater heat transfer to the working fluid and greater thermal management capacity.

In some embodiments, the interior surfaces 448 have at least one boiling enhancement surface feature (BESF) thereon. For example, the BESF may include one or more surface treatments, recesses, or protrusions on the interior surfaces that promote the formation of vapor bubbles on and/or the release of vapor bubbles from the interior surfaces 448. In some embodiments, the BESF is or includes a boiling enhancement coating (BEC) applied to the interior surface 448 of the wicking heat spreader 436. For example, the wicking heat spreader 436 may have a frame 450 with channels 440, 442 therein, and the BEC may be applied to the surface(s) of the frame 450 such that the BEC is located on at least one interior surface 448 of the frame 450. In some embodiments, the BEC is located on at least 50% of the interior surface area of the frame 450. In some embodiments, the BEC is located on substantially all of the interior surface area of the frame 450. In some embodiments, the BEC is located on substantially all of the surface area of the frame 450 in contact with or configured to contact working fluid (i.e., outer surfaces 444 and interior surfaces 448).

Figure 5:
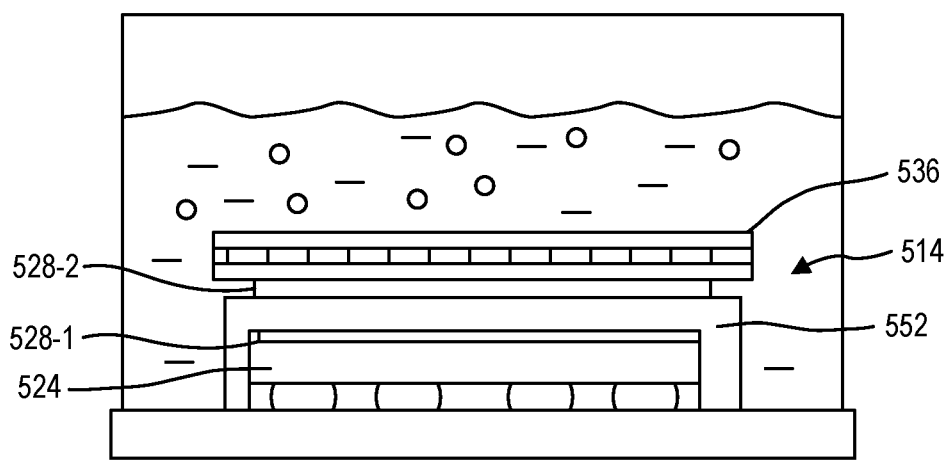
FIG. 5 is a side view of another wicking heat spreader, according to at least one embodiment of the present disclosure.

FIG. 5 is a side cross-sectional view of another embodiment of a thermal management device including a wicking heat spreader 536 according to the present disclosure. In some embodiments, the wicking heat spreader 536 is thermally connected to a heat-generating component 514 through an intermediate heat spreader 552. For example, some heat spreaders, such as vapor chambers or graphite sheets have high in-plane thermal conductive to spread heat laterally, but such planar heat spreaders may have comparatively low surface area to volume ratios to efficiently transfer heat to the working fluid.

In some embodiments, the intermediate heat spreader 552 receives heat from the die 524 or other portion of a heat-generating component 514 through a first TIM 528-1, and the intermediate heat spreader 552 provides lateral heat spreading within a plane of the intermediate heat spreader 552. The intermediate heat spreader 552 then allows the heat to be transferred more or substantially uniformly to the wicking heat spreader 536 through a second TIM 528-2.

Figure 6:
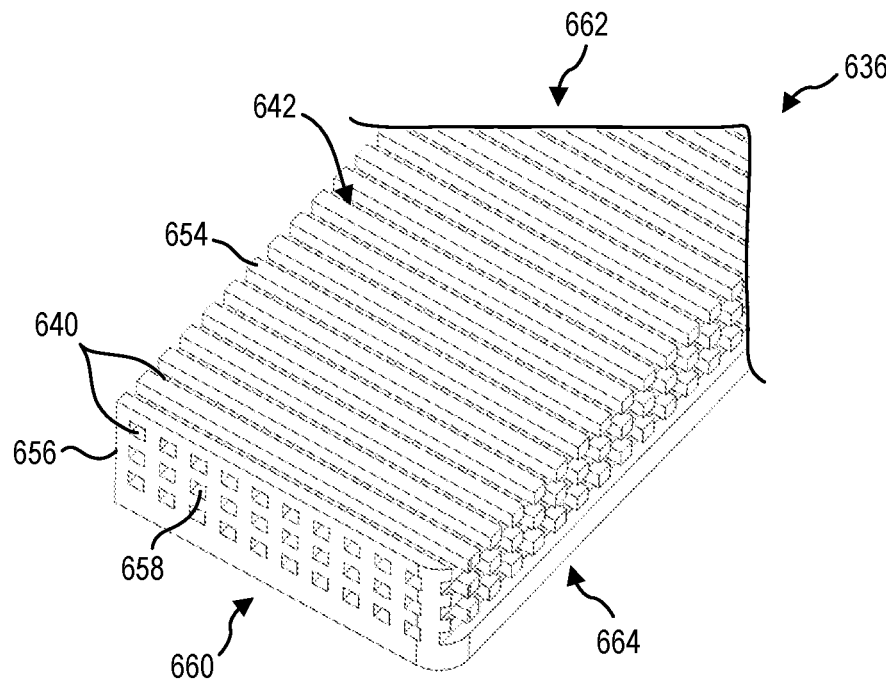
FIG. 6 is a perspective view of a wicking heat spreader, according to at least one embodiment of the present disclosure.

FIG. 6 is a perspective view of an embodiment of a wicking heat spreader 636 according to the present disclosure. In some embodiments, the wicking heat spreader 636 includes a plurality of horizontal rails 654 with horizontal channels 640 therebetween and a plurality of vertical rails 656 with vertical channels 642 therebetween.

In some embodiments, the horizontal channels 640 allow for intakes 658 to the horizontal channels 640 on the lateral sides 660 of the wicking heat spreader 636. The horizontal channels 640 connect to vertical channels 642 to flow working fluid through the wicking heat spreader 636. The working fluid can then exhaust from the wicking heat spreader 636.

In some embodiments, at least one of the horizontal channels 640 is straight and continuous from a front surface (e.g., a lateral side 660) to a rear surface (e.g., a lateral side 660 opposite the front surface). In some embodiments, all of the horizontal channels 640 between the front surface and the rear surface are straight and continuous. In some embodiments, at least one of the horizontal channels 640 has a curve, a bend, a corner, or another deviation that causes fluid flow to change direction compared to a straight channel. In some embodiments, at least one of the horizontal channels 640 terminates between a first lateral side 660 and a second lateral side 660.

In some embodiments, at least one of the horizontal channels 640 allows fluid flow from a front surface of the wicking structure to a rear surface of the wicking structure. In some embodiments, at least one of the horizontal channels 640 terminates between a first lateral side 660 and a second lateral side 660 and/or exhausts out a top surface 662 of the wicking heat spreader 636.

In some embodiments, at least one of the vertical channels 642 is straight and continuous from a bottom surface 664 to the top surface 662. In some embodiments, all of the vertical channels 642 between the bottom surface 664 and the top surface 662 are straight and continuous. In some embodiments, at least one of the vertical channels 642 has a curve, a bend, a corner, or another deviation that causes fluid flow to change direction compared to a straight channel. In some embodiments, at least one of the vertical channels 642 terminates between a bottom surface 664 and the top surface 662.

In some embodiments, at least one of the vertical channels 642 allows fluid flow from a bottom surface 664 and the top surface 662. In some embodiments, at least one of the vertical channels 642 terminates between a bottom surface 664 and the top surface 662 and/or exhausts out a lateral side 660 of the wicking heat spreader 636.

Figure 7:
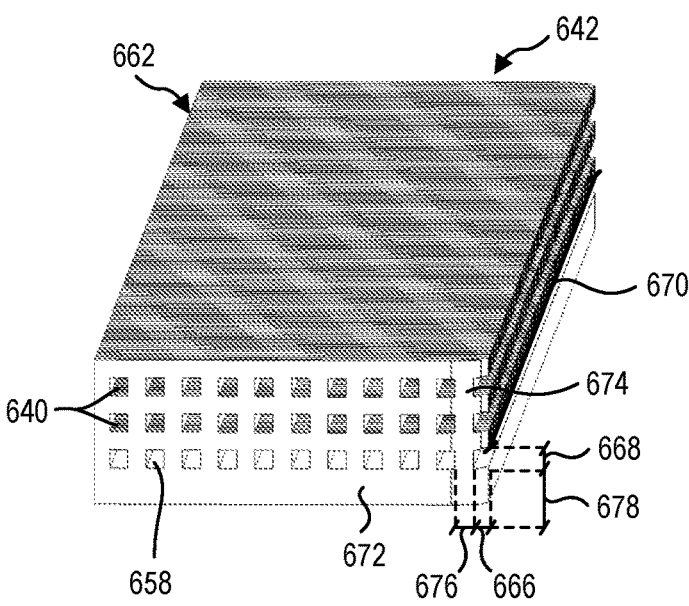
FIG. 7 is a side view of the wicking heat spreader of FIG. 6.

FIG. 7 is an end view of the embodiment of a wicking heat spreader 636 of FIG. 6. The wicking heat spreader 636 has a plurality of horizontal channels 640 with intakes 658 on the lateral side 660. In some embodiments, the horizontal channels 640 have uniform transverse dimension (e.g., perpendicular to a direction of flow through the horizontal channel 640) such as a channel width 666 or channel height 668. In other embodiments, at least one horizontal channel 640 has a transverse area (e.g., channel width 666 by channel height 668) that changes along a length 670 of the horizontal channel 640. For example, vapor bubbles forming in the horizontal channel 640 may create a pressure in the wicking heat spreader 636 that resists ingress of additional working fluid. In some embodiments, the horizontal channel 640 may increase in cross-sectional area toward a center of the wicking heat spreader 636 to accommodate the increase in volume of the working fluid upon vaporization.

The wicking heat spreader 636 has a plurality of vertical channels 642 with openings on the top surface 662. In some embodiments, the vertical channels 642 have uniform transverse dimension (e.g., perpendicular to a direction of flow through the vertical channels 642) such as a channel width 666 or channel height 668 illustrated in relation to the horizontal channels 640. In other embodiments, at least one vertical channel 642 has a transverse area that changes along a length of the vertical channel 642 toward the top surface 662. For example, vapor bubbles forming in the vertical channel 642 may create a pressure in the wicking heat spreader 636 that resists ingress of additional working fluid. In some embodiments, the vertical channel 642 may increase in cross-sectional area toward the top surface 662 of the wicking heat spreader 636 to accommodate the increase in volume of the working fluid upon vaporization.

In some embodiments, the wicking heat spreader 636 has a plurality of horizontal rails 672. In some embodiments, the horizontal rails 672 have uniform transverse dimension (e.g., perpendicular to a direction of flow through the horizontal channel 640) such as a rail width 676 or rail height 678. In other embodiments, at least one horizontal rail 672 has a transverse area (e.g., rail width 676 by channel height 678) that changes along a length of the horizontal rail 672. For example, vapor bubbles forming in the horizontal channel 640 may create a pressure in the wicking heat spreader 636 that resists ingress of additional working fluid. In some embodiments, one or more horizontal rails 672 may decrease (e.g., taper) in cross-sectional area to allow the horizontal channel 640 to increase in cross-sectional area toward a center of the wicking heat spreader 636 to accommodate the increase in volume of the working fluid upon vaporization.

In some embodiments, the wicking heat spreader 636 has a plurality of vertical rails 674. In some embodiments, the vertical rails 674 have uniform transverse dimension (e.g., perpendicular to a direction of flow through the vertical channel 642) such as analog to the rail width 676 or rail height 678 described in relation to the horizontal rails. In other embodiments, at least one vertical rail 674 has a transverse area that changes along a length of the vertical rail 674. For example, vapor bubbles forming in the vertical channel 642 may create a pressure in the wicking heat spreader 636 that resists ingress of additional working fluid. In some embodiments, one or more vertical rails 674 may decrease (e.g., taper) in cross-sectional area toward the top surface 662 to allow the horizontal channel 640 to increase in cross-sectional area toward a center of the wicking heat spreader 636 to accommodate the increase in volume of the working fluid upon vaporization.

Figure 8:
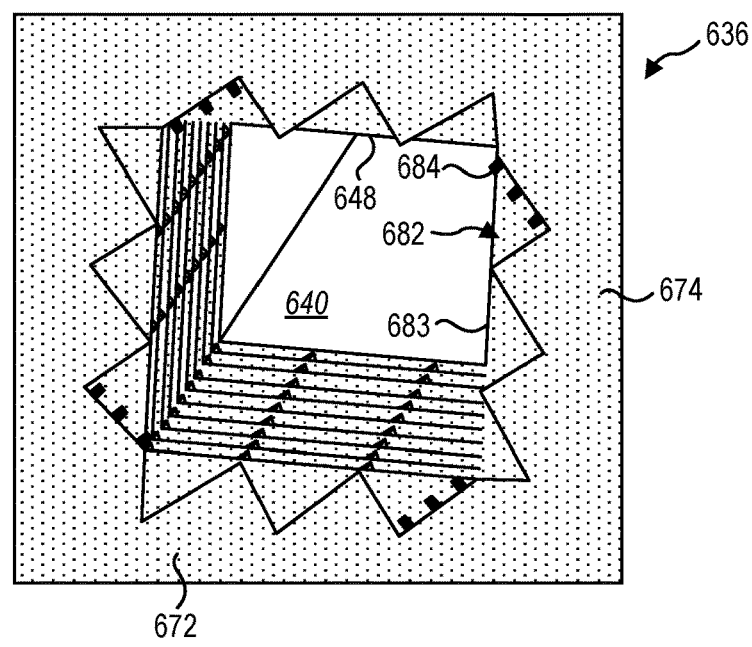
FIG. 8 is a detail view of the wicking heat spreader of FIG. 6.

FIG. 8 is a detail view of a channel of the wicking heat spreader 636 of FIG. 6 and FIG. 7. To promote the formation of and/or release of vapor bubbles on the interior surface of the channels, in some embodiments, the channels includes one of more BESF. FIG. 8 is a detail view of a portion of a horizontal channel 640 of the wicking heat spreader 636, but it should be understood that any BESF described in relation to a horizontal channel may be applicable to a vertical channel or to an outer surface of the wicking heat spreader. In some embodiments, the BESF includes a BEC, a recess, a protrusion, or combinations thereof.

For example, a BEC 680 may be deposited on an interior surface 648 of a horizontal rail 672 or a vertical rail 674 of the wicking heat spreader 636. The BEC 680 may be deposited by physical vapor deposition, chemical vapor deposition, sputtering, electroplating, or other coating deposition methods to create a surface roughness, texture, or chemical composition that promotes the formation of and/or release of vapor bubbles on the interior surface of the channels. In some embodiments, the BEC 680 is etched into the interior surface 648 of a horizontal rail 672 or a vertical rail 674 of the wicking heat spreader 636. For example, the BEC 680 may be etched by ion etching or chemical etching to create a surface roughness or texture that promotes the formation of and/or release of vapor bubbles on the interior surface of the channels.

In some embodiments, the BESF includes or is a recess 682 in the interior surface 648. The recess 682 may include a curve or a corner. In some embodiments, the recess 682 is positioned in the interior surface 648 to promote the formation of a vapor bubble that is smaller than the cross-sectional area of the channel (e.g., the horizontal channel 640). For example, the recess 682 may have an opening 683 that is no more than half of the transverse dimension (such as the channel width or height) of the channel such that the vapor bubble that forms in the recess 682 is smaller than the channel area. In other examples, the opening 683 is no more than ⅓ of the transverse dimension of the channel.

A protrusion 684 may be located on the interior surface 648 to promote the formation of and/or release of vapor bubbles on the interior surface of the channels. In some embodiments, the protrusion 684 is formed by three-dimensional printing on the interior surface 648. In some embodiments, the protrusion 684 is formed by etching or machine material to leave the protrusion 684 remaining.

The BESF described herein may be combined in any manner. In some embodiments, the protrusion 684 is located on a recess surface in the recess 682. In some embodiments, the protrusion 684 has a BEC located thereon. In some embodiments, the recess 682 has a BEC positioned therein.

Figure 9:
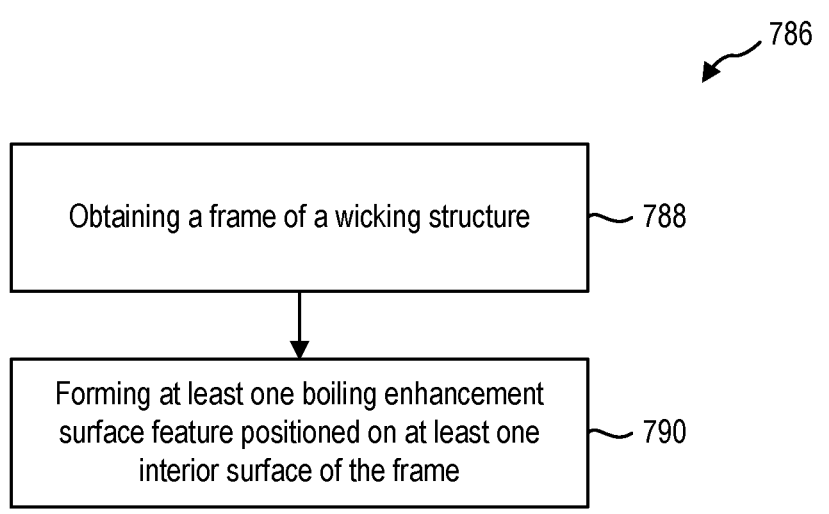
FIG. 9 is a flowchart illustrating a method of manufacturing a wicking heat spreader, according to at least one embodiment of the present disclosure.

FIG. 9 is a flowchart illustrating an embodiment of a method 786 of manufacturing a wicking heat spreader. In some embodiments, the method includes obtaining a frame of a wicking structure at 788 and forming at least one boiling enhancement surface feature positioned on at least one interior surface of the frame at 790. In some embodiments, the frame includes at least one horizontal channel and at least one vertical channel that intersect and allow fluid flow therethrough.

In some embodiments, obtaining a frame includes machining the frame from a billet. In some embodiments, obtaining a frame includes three-dimensional printing of the frame. In some embodiments, obtaining a frame includes casting the frame. In some embodiments, obtaining a frame includes sintering of the frame. In some embodiments, obtaining a frame includes injection molding of the frame. In some embodiments, obtaining a frame includes a combination of machining, three-dimensional printing, casting, sintering, and injection molding. In some embodiments, obtaining a frame includes obtaining a first portion of the frame by any method described herein and subsequently additively manufacturing a second portion of the frame onto the first portion of the frame. For example, the first portion of the frame may have a BEC deposited thereon, and the second portion of the frame is additively manufactured over the first portion, thereby allowing an interior surface of the frame to have a BEC that would otherwise be inaccessible for some deposition techniques.

In some embodiments, forming at least one BESF on an interior surface of the frame includes depositing or etching a BEC on the interior surface. In some embodiments, forming at least one BESF on an interior surface of the frame includes forming a recess in the interior surface. In some embodiments, the recess is formed by etching. In some embodiments, the recess is formed by machining. In some embodiments, the recess is formed during three-dimensional printing of the frame. In some embodiments, forming at least one BESF on an interior surface of the frame includes forming a protrusion on the interior surface. In some embodiments, the protrusion is printed on the interior surface. In some embodiments, the protrusion is deposited on the interior surface. In at least one embodiment, the protrusion is formed in a recess of the interior surface.

Figure 10:
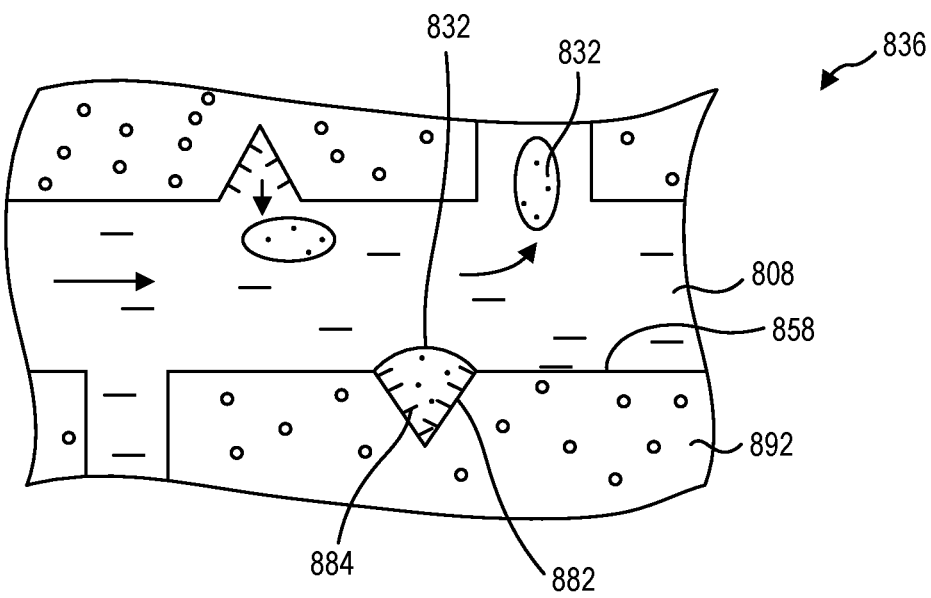
FIG. 10 is a detail view of vapor bubble formation in a wicking heat spreader, according to at least one embodiment of the present disclosure.

FIG. 10 is a cross-sectional view of an embodiment of a wicking heat spreader 836 with a porous frame 892 according to the present disclosure. A vapor bubble 832 may form in a recess 882 of the interior surface 848 of the frame 892. In some embodiments, the recess 882 includes protrusions 884. Liquid phase 808 flow through the channels of the wicking heat spreader promotes the release of the vapor bubbles 832. In some embodiments, refilling of the vacated volume and/or release of the vapor bubble 832 from the frame 892 can be increased by the use of a porous frame 892.

For example, a porous frame 892 may allow the liquid phase 808 of the working fluid to enter the wicking heat spreader 836 more easily and/or create a fluid pressure behind the vapor bubble 832 to aid in releasing the vapor bubble 832.

Figure 11:
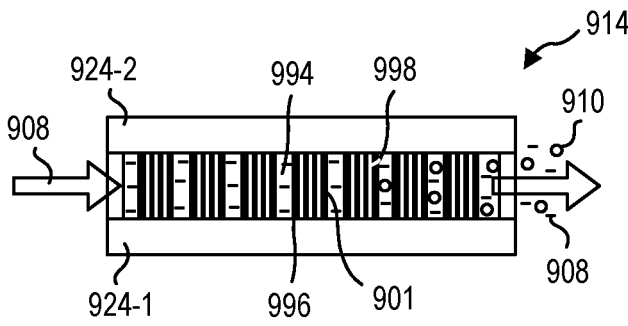
FIG. 11 is a side view of a stacked-die processor, according to at least one embodiment of the present disclosure.

In some embodiments, working fluid (either two-phase or single-phase working fluid) can be directed adjacent to and/or directly contacting a die in a heat-generating component. FIG. 11 is a side schematic representation of a stacked die processor (e.g., a heat-generating component 914) including a first die 924-1 and a second die 924-2 with a microfluidic volume 994 therebetween. In some embodiments, the microfluidic volume 994 allows flow of a liquid phase 908 of a working fluid through the microfluidic volume 994 and around a plurality of pin fins 996 positioned between and connected to the first die 924-1 and the second die 924-2. In some embodiments, the pin fins 996 are integrally formed with one or both of the first die 924-1 and the second die 924-2 to allow direct on-chip cooling of the first die 924-1 and the second die 924-2.

In some embodiments, the working fluid is a single-phase working fluid, and the liquid phase 908 of the working fluid flows through the microfluidic volume from a first lateral side 960 of the stacked-die processor to a second lateral side 960 of the stacked die processor. In some embodiments, the first lateral side 960 and second lateral side 960 are opposite one another. In some embodiments, the lateral side 960 and second lateral side 960 are abutting one another at a corner of the stacked-die processor, such as allowing a 90° turn to the flow of working fluid through the microfluidic volume 994. In some embodiments, the top surface of the first die 924-1 and the bottom surface of the second die 924-2 are planar and parallel to one another such that a height of the microfluidic volume 994 is constant through the microfluidic volume 994.

The pin fins 996 connect the first die 924-1 and the second die 924-2 to one another and may provide thermal conductivity therebetween, such as conducting heat from the first die 924-1 and the second die 924-2 into the pin fins to assist in transferring the heat into the liquid phase 908 of the working fluid. In some embodiments, at least one of the pin fins 996 has a through-silicon via (TSV) 998 positioned therein to provide electrically connection and communication through the pin fins between the electronic components and circuitry of the first die 924-1 and the second die 924-2. In some embodiments, the TSV 998 is vulnerable to thermal damage, and efficient removal of heat from the pin fin 996 may increase the performance and/or operational lifetime of the TSVs 998 and/or the stacked-die processor.

In some embodiments, the pin fins 996 have BESFs on the pin surface 901, such as a BEC, recess, protrusion, or combinations thereof, such as described in relation to FIG. 8. The BESFs may be positioned on all of the pin surface 901 contacting the working fluid, or the BESFs may be positioned on less than all of the pin surface 901. For example, the BESFs may increase drag on the working fluid, inhibiting flow of the working fluid through the microfluidic volume 994. In some embodiments, the BESFs are selectively located on the pin surface 901 relative to the direction of flow of the working fluid to promote the formation of and/or release of vapor bubbles (e.g., of the vapor phase 910 of the working fluid) while lessening the drag on the flow of the working fluid.

Figure 12:
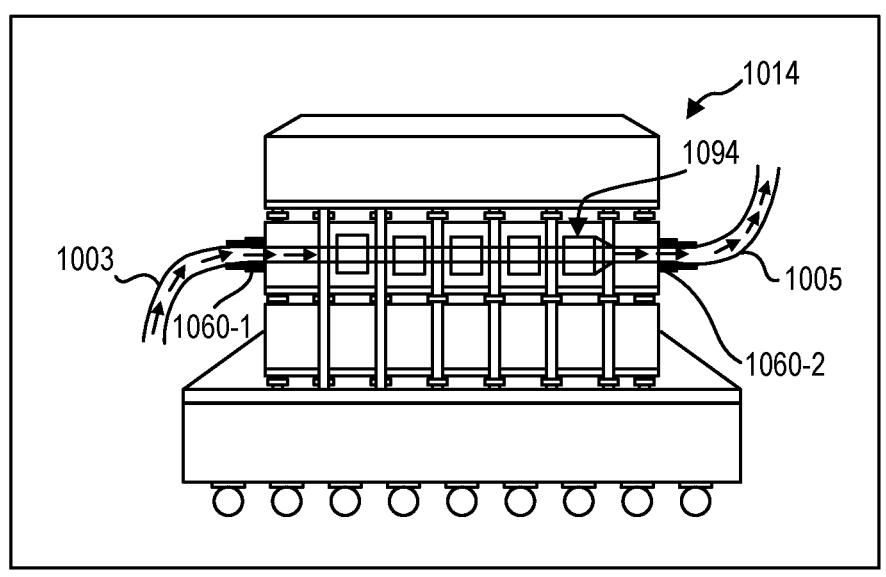
FIG. 12 is a side view of closed-loop microfluidic cooling, according to at least one embodiment of the present disclosure.

FIG. 12 is a side schematic view of closed-loop microfluidic cooling system with a working fluid therein. In some embodiments, a closed loop system for cooling a stacked-die heat generating component 1014 includes an inlet conduit 1003 connected to a first lateral side 1060-1 and an outlet conduit 1005 connected to a second lateral side 1060-2. In other embodiments, the inlet conduit 1003 and outlet conduit 1005 connected to the same lateral side 1060-1 to circulate working fluid in the microfluidic volume 1094.

Figure 13:
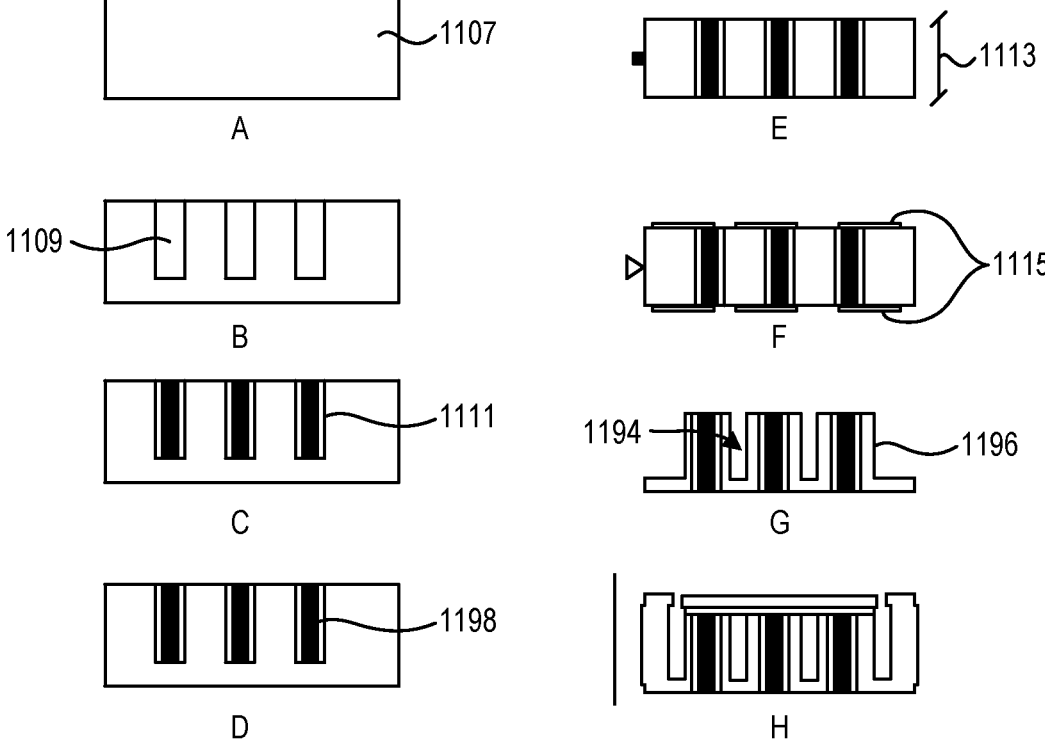
FIG. 13 illustrates a method of manufacturing pin fins, according to at least one embodiment of the present disclosure.

FIG. 13 is an embodiment of a method of manufacturing of a stacked-die processor. Step A illustrates the initial blank wafer 1107, and holes 1109 in what will be the pin fins 1196 are created by high plasma etching, reactive ion etching, or other etching process to remove at least a portion of the silicon wafer 1107 at B. A dielectric layer or liner 1111 is applied to the pin surfaces 1101 at C, and a conductive material is positioned in the holes 1109 to form the TSVs 1198 at D before the wafer 1107 is mechanically polished to the desired thickness 1113 at E. In some embodiments, the TSVs 1198 are tested by fabricating interconnects 1115 across the contact surfaces of the TSVs 1198 as F before the wafer 1107 around the TSVs 1198 is removed at G, such as by etching, at G to form the pin fins 1196 with the TSVs 1198 therethrough and the microfluidic volume 1194 around the pin fins 1196. In some embodiments, the microfluidic volume is at least partially closed or capped at H to enclose the microfluidic volume and/or direct working fluid through the microfluidic volume.

Figure 14:
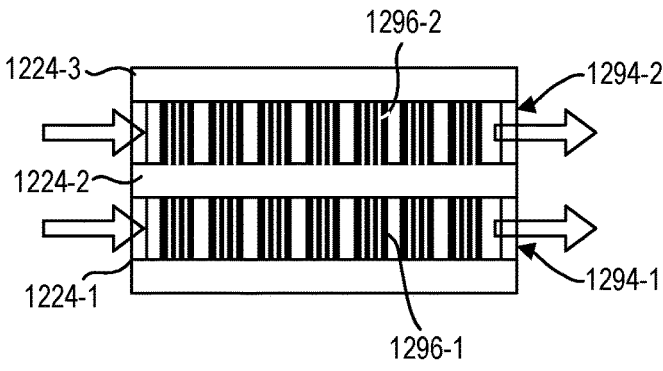
FIG. 14 is a side view of a stacked-die processor with three dies, according to at least one embodiment of the present disclosure.

FIG. 14 is a side view of an embodiment of a stacked-die processor including a first die 1224-1, a second die 1224-2, and a third die 1224-3 stacked with pin fins 1296-1, 1296-2 containing TSVs 1298-1, 1298-2 therebetween. In some embodiments, a first microfluidic volume 1294-1 is located between the first die 1224-1 and the second die 1224-2, and a first set of pin fins 1296-1 couples the first die 1224-1 and the second die 1224-2 through the first microfluidic volume 1294-1. In some embodiments, a second microfluidic volume 1294-2 is located between the second die 1224-2 and the third die 1224-3, and a second set of pin fins 1296-2 couples the second die 1224-2 and the third die 1224-3 through the second microfluidic volume 1294-2.

As described herein, the pin fins 1296-1, 1296-2 have, in some embodiments, at least one BESF position on a pin surface thereof. In some embodiments, the first set of pin fins 1296-1 and the second set of pin fins 1296-2 have the same BESF(s) thereon. For example, the first set of pin fins 1296-1 may have a BEC thereon and the second set of pin fins 1296-2 may have the same BEC thereon. In other examples, the first set of pin fins 1296-1 may have a plurality of recesses in a pin surface thereof, and the second set of pin fins 1296-2 may have a plurality of recesses in a pin surface thereof. In other examples, the first set of pin fins 1296-1 may have a plurality of protrusions on a pin surface thereof, and the second set of pin fins 1296-2 may have a plurality of protrusions on a pin surface thereof.

In some embodiments, the first set of pin fins 1296-1 and the second set of pin fins 1296-2 have different BESFs thereon. For example, the first set of pin fins 1296-1 may have a BEC thereon and the second set of pin fins 1296-2 may lack a BEC or have a different BEC thereon. In other examples, the first set of pin fins 1296-1 may have a plurality of recesses in a pin surface thereof, and the second set of pin fins 1296-2 may lack recesses in a pin surface thereof or have recesses in a different pattern or with different dimensions. In other examples, the first set of pin fins 1296-1 may have a plurality of protrusions on a pin surface thereof, and the second set of pin fins 1296-2 may lack protrusions on a pin surface thereof or have protrusions in a different pattern or with different dimensions. In some embodiments, the thermal management requires of the dies 1224-1, 1224-2, 1224-3 may be different, and the BESFs of the first set of pin fins 1296-1 and the second set of pin fins 1296-2 may be different to effect the different thermal management properties.

In some embodiments, the working fluid is urged through the first microfluidic volume 1294-1 and through the second microfluidic volume 1294-2 at the same flow rate. For example, a manifold forming at least a portion of the side wall of the microfluidic volume 1294-1, 1294-2 is connected to an inlet conduit may provide equal flow rate and/or equal fluid pressure to both the first microfluidic volume 1294-1 and the second microfluidic volume 1294-2. In some embodiments, the flow rate is different, such as when different thermal management is required by different portions of the stacked-die processor. For example, a first inlet conduit may provide a first flow rate and/or fluid pressure to the first microfluidic volume 1294-1 and a second inlet conduit may provide a second flow rate and/or fluid pressure to the second microfluidic volume 1294-2.

In some embodiments, the working fluid in the first microfluidic volume 1294-1 is the same working fluid in the second microfluidic volume 1294-2. In some embodiments, the working fluid in the first microfluidic volume 1294-1 is shared with the second microfluidic volume 1294-2. In other embodiments, a first working fluid is provided to the first microfluidic volume 1294-1, and a second working fluid is provided to the second microfluidic volume 1294-2. The first working fluid and second working fluid may have different boiling temperatures, different latent heat of boiling, different thermal capacities, different viscosities, or different reactivities, depending on different thermal management requirements of the different dies of the stacked-die processor.

Figure 15:
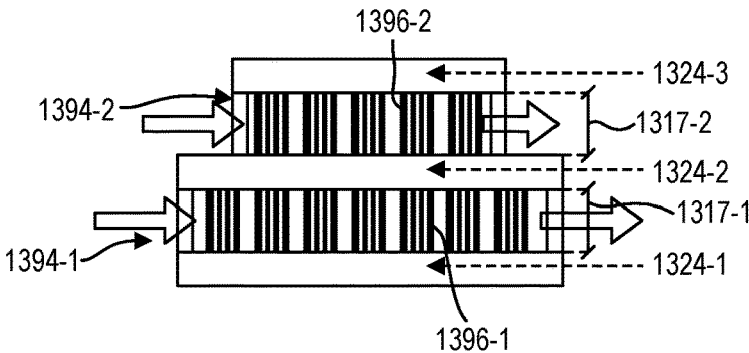
FIG. 15 is a side view of a stacked-die processor with different sized dies, according to at least one embodiment of the present disclosure.

While some embodiments described herein have a plurality of dies that are the same area, in other embodiments, at least one die of a stacked-die processor has a different shape or area than another die in the stacked-die processor. FIG. 15 is a side view of an embodiment of a heat generating component 1314 including a stacked-die processor including dies 1324-1, 1324-2, 1324-3 of varying sizes. A first die 1324-1 and second die 1324-2 (such as a CPU and GPU) have substantially the same area, while a third die 1324-3 (such as memory) has a different area. In some embodiments, different dies may have the same in-plane aspect ratio and have different areas, such as two different size squares. In some embodiments, different dies may have different in-plane aspect ratios and have the same area, such as two rectangles turned 90° relative to one another. In some embodiments, different dies may have different areas but share at least one dimension of their area, such as the second die 1324-2 and third die 1324-2 having different lengths in the direction of flow, but having equal widths perpendicular to the direction of flow. In another example, the first die 1324-1 and the second die 1324-2 may have equal lengths in the direction of flow, but having different widths perpendicular to the direction of flow.

Different size dies may have different thermal management requirements. In some embodiments, a first set of pin fins 1396-1 and a second set of pin fins 1396-2 have different BESFs thereon. For example, the first set of pin fins 1396-1 may have a BEC thereon and the second set of pin fins 1396-2 may lack a BEC or have a different BEC thereon. In other examples, the first set of pin fins 1396-1 may have a plurality of recesses in a pin surface thereof, and the second set of pin fins 1396-2 may lack recesses in a pin surface thereof or have recesses in a different pattern or with different dimensions. In other examples, the first set of pin fins 1396-1 may have a plurality of protrusions on a pin surface thereof, and the second set of pin fins 1396-2 may lack protrusions on a pin surface thereof or have protrusions in a different pattern or with different dimensions. In some embodiments, the thermal management requires of the dies 1324-1, 1334-2, 1324-3 may be different, and the BESFs of the first set of pin fins 1396-1 and the second set of pin fins 1396-2 may be different to effect the different thermal management properties.

In some embodiments, the working fluid is urged through the first microfluidic volume 1394-1 and through the second microfluidic volume 1394-2 at the same flow rate. For example, a manifold forming at least a portion of the side wall of the microfluidic volume 1394-1, 1394-2 is connected to an inlet conduit may provide equal flow rate and/or equal fluid pressure to both the first microfluidic volume 1394-1 and the second microfluidic volume 1394-2. In some embodiments, the flow rate is different, such as when different thermal management is required by different portions of the stacked-die processor. For example, a first inlet conduit may provide a first flow rate and/or fluid pressure to the first microfluidic volume 1394-1 and a second inlet conduit may provide a second flow rate and/or fluid pressure to the second microfluidic volume 1394-2.

In some embodiments, the working fluid in the first microfluidic volume 1394-1 is the same working fluid in the second microfluidic volume 1394-2. In some embodiments, the working fluid in the first microfluidic volume 1394-1 is shared with the second microfluidic volume 1394-2. In other embodiments, a first working fluid is provided to the first microfluidic volume 1394-1, and a second working fluid is provided to the second microfluidic volume 1394-2. The first working fluid and second working fluid may have different boiling temperatures, different latent heat of boiling, different thermal capacities, different viscosities, or different reactivities, depending on different thermal management requirements of the different dies of the stacked-die processor.

In some embodiments, the pin fin height can vary between sets of pin fins. For example, a first pin fin height 1317-1 of the first set of pin fins 1396-1 may be different from a second pin fin height 1317-2 of the second set of pin fins 1396-2.

Figure 16:
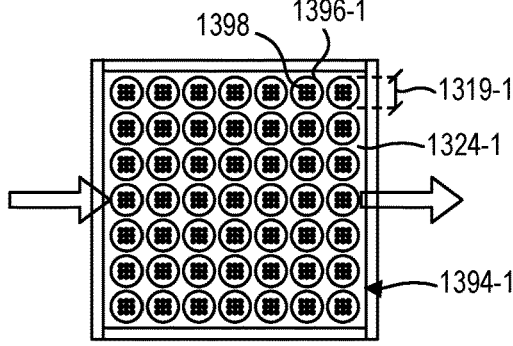
FIG. 16 is a top cross-sectional view of the stacked-die processor of FIG. 15, according to at least one embodiment of the present disclosure.

FIG. 16 is a top cross-sectional view of the first set of pin fins 1396-1 of FIG. 15. In some embodiments, a pin fin has a pin fin aspect ratio of the pin fin height (e.g., first pin fin height 1317-1 of FIG. 15) to pin fin maximum transverse dimension 1319-1. In some embodiments, a pin fin has a circular shape in transverse cross-section (such as illustrated in FIG. 16), and the pin fin maximum transverse dimension 1319-1 is a diameter of the pin fin. In some embodiments, a pin fin has a square shape in transverse cross-section, and the pin fin maximum transverse dimension 1319-1 is a diagonal dimension of the pin fin. In some embodiments, a pin fin has an oval shape in transverse cross-section, and the pin fin maximum transverse dimension 1319-1 is a major axis of the pin fin. In some embodiments, the maximum transverse dimension 1319-1 is no more than 100 micrometers. In some embodiments, the maximum transverse dimension 1319-1 is no more than 75 micrometers. In some embodiments, the maximum transverse dimension 1319-1 is no more than 50 micrometers.

In some embodiments, the pin fin aspect ratio is approximately 1.0. In some embodiments, the pin fin aspect ratio is greater than 1.0. In some embodiments, the pin fin aspect ratio is no more than 1.0. In some embodiments, the pin fin aspect ratio varies from one pin fin to another in a set of pin fins. For example, the pin fin aspect ratio may increase in a direction of flow of working fluid through the microfluidic volume. By decreasing the maximum transverse dimension 1319 of the pin fins in the direction of flow, there may be greater amounts of microfluidic volume between the pin fins as vapor bubble formation occupies a larger proportion of the microfluidic volume.

The pin fin aspect ratio is at least partially based on the number and diameter of TSVs 1398 in the pin fin. For example, a higher pin fin aspect ratio reduces the volume of the pin fin, allowing greater surface area-to-volume ratio and more efficient cooling by working fluid in the microfluidic volume 1394-1. However, a higher pin fin aspect ratio also reduces the volume of the pin fin, limiting the quantity and/or size of the TSVs 1398 positioned therethrough, which may limit performance of the processor.

A volume ratio of the stacked-die processor is the amount of total volume of the microfluidic volume that is occupied by the pin fins. For example, a volume ratio of 1.0 means there is no microfluidic volume and the entire space between the first die and the second die is filled with silicon and/or TSVs. A volume ratio of 0.5 means that there is an equal amount of pin fins and microfluidic volume between the first die and the second die. In some embodiments, the volume ratio is no more than 0.9. In some embodiments, the volume ratio is no less than 0.5. In some embodiments, the volume ratio is approximately 0.75.

A pin fin 1396-1 may have any quantity of TSVs 1398 therethrough. In some embodiments, a pin fin 1396-1 has at least one TSV 1398 therethrough. In some embodiments, a pin fin 1396-1 has at least three TSVs 1398 therethrough. In some embodiments, a pin fin 1396-1 has at least 7 TSVs 1398 therethrough. In some embodiments, the TSVs 1398 of a pin fin 1396-1 are arranged in a square (such as illustrated in FIG. 16). In some embodiments, the TSVs 1398 of a pin fin 1396-1 are arranged in a hexagonal close-pack arrangement.

Figure 17:
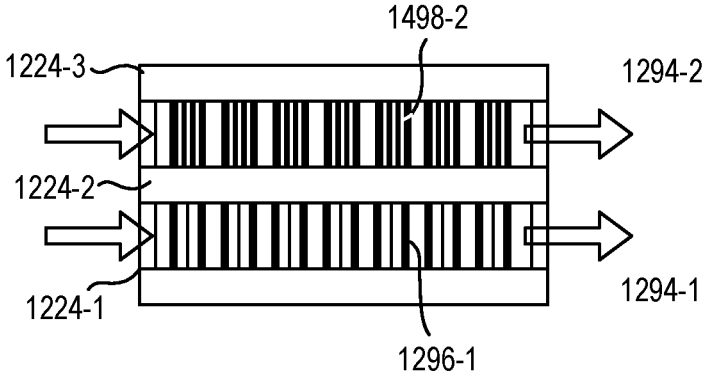
FIG. 17 is a side view of a stacked-die processor with pin fins and TSVs of different sizes, according to at least one embodiment of the present disclosure.

In some embodiments, a stacked-die processor includes a first set of pin fins with a first pin fin aspect ratio and a second set of pin fins with a second pin fin aspect ratio. FIG. 17 is a side view of an embodiment of a stacked-die processor including three dies 1424-1, 1424-2, 1424-3 with TSVs 1498-1, 1498-2 of varying sizes and aspect ratios in each set of pin fins 1496-1, 1496-2.

Figure 18:
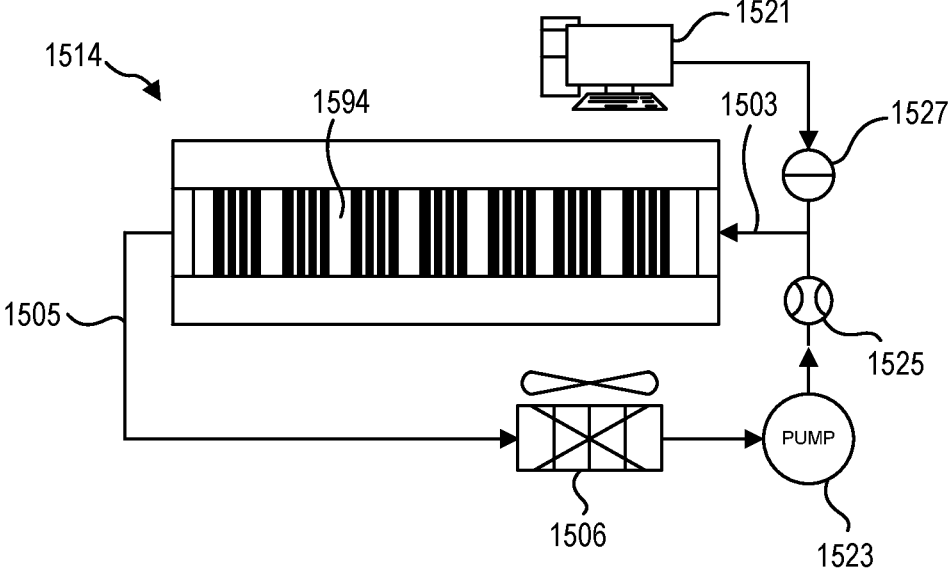
FIG. 18 is a system diagram of a closed-loop microfluidic cooling system, according to at least one embodiment of the present disclosure.

FIG. 18 is a system diagram of a system for working fluid delivery to the microfluidic volume 1594 of a stacked-die heat-generating component 1514. In some embodiments, a flow of the liquid phase 1508 of the working fluid is controlled by a controller 1521 that is in data communication with a pump 1523 and one or more sensors, such as a flow meter 1525, temperature gauge 1527, or other sensors that measure operating conditions of the working fluid in the inlet conduit 1503 and/or the outlet conduit 1505. The outlet conduit 1505, in some embodiments, circulates the hot working fluid (which may include both liquid phase and vapor phase) to a condenser 1506 or heat exchanger.

In some embodiments, the controller 1521 is in data communication with the heat-generating component to receive operating metrics of the heat-generating component, such as clock frequency, core voltage, core temperature, power draw, etc. In some embodiments, a flow rate of the working fluid through the inlet conduit 1503 into the microfluidic volume 1594 is controlled by the controller 1521 based at least partially on the operating conditions of the working fluid in the inlet conduit 1503 and/or the outlet conduit 1505 and/or the operating metrics of the heat-generating components. The controller 1521 may adjust the flow rate of the working fluid by sending instructions to the fluid pump 1523 and/or to a valve or baffle in the conduits.

In some embodiments, the flow rate of the working fluid from the fluid pump is less than 1.0 liters per minute. In some embodiments, the flow rate of the working fluid from the fluid pump is less than 0.5 liters per minute.

Figure 19:
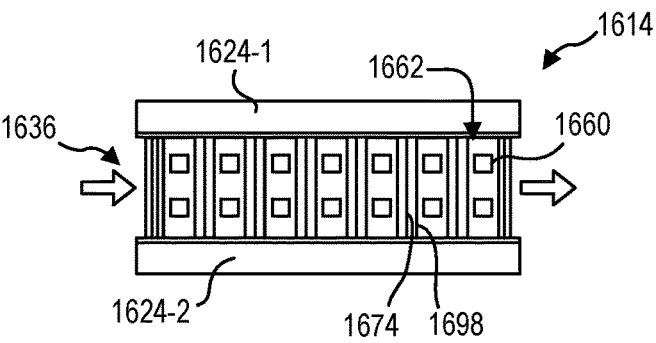
FIG. 19 is a side view of a stacked-die processor with a wicking heat spreader positioned between a first die and a second die, according to at least one embodiment of the present disclosure.

FIG. 19 is a side view of an embodiment of a stacked-die processor with a wicking heat spreader 1636 with horizontal channels 1660 and vertical channels 1662 positioned therebetween. The stacked-die processor includes a first die 1624-1 and a second die 1624-2. The wicking heat spreader 1636, such as any embodiment of a wicking heat spreader described in relation to FIG. 3 through FIG. 10, is positioned between the first die 1624-1 and the second die 1624-2. In some embodiments, at least a portion of the wicking heat spreader 1636 is integrally formed with silicon of one or more of the first die 1624-1 and the second die 1624-2. In some embodiments, the wicking heat spreader 1636 is manufactured as a separate and discrete component, and the wicking heat spreader 1636 is affixed to one or both of the first die 1624-1 and the second die 1624-2. For example, at least a portion of a vertical rail 1674 has one or more TSVs 1698 positioned therein, similar to the embodiments of pin fins described in relation to FIG. 11 through 18.

Figure 20:
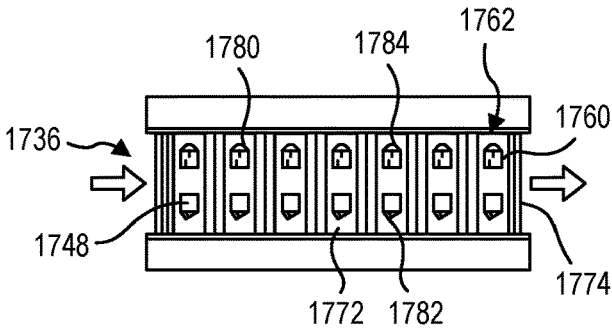
FIG. 20 is a side view of a stacked-die processor with a wicking heat spreader with boiling enhancement surface features, according to at least one embodiment of the present disclosure.

FIG. 20 is a side view of an embodiment of a stacked-die processor with a wicking heat spreader 1736 with a plurality of BESFs positioned thereon. In some embodiments, the wicking heat spreader 1736 includes one or more BESFs located on an interior surface 1748 of the horizontal channels 1760 and vertical channels 1762. In some embodiments, the BESFs include a BEC 1780, a recess 1782, a protrusion 1784, or combinations thereof.

For example, a BEC 1780 may be deposited on an interior surface 1748 of a horizontal rail 1772 or a vertical rail 1774 of the wicking heat spreader 1736. The BEC 1780 may be deposited by physical vapor deposition, chemical vapor deposition, sputtering, electroplating, or other coating deposition methods to create a surface roughness, texture, or chemical composition that promotes the formation of and/or release of vapor bubbles on the interior surface of the channels. In some embodiments, the BEC 1780 is etched into the interior surface 1748 of a horizontal rail 1772 or a vertical rail 1774 of the wicking heat spreader 1736. For example, the BEC 1780 may be etched by ion etching or chemical etching to create a surface roughness or texture that promotes the formation of and/or release of vapor bubbles on the interior surface of the channels.

In some embodiments, the BESF includes or is a recess 1782 in the interior surface 1748. The recess 1782 may include a curve or a corner. In some embodiments, the recess 1782 is positioned in the interior surface 1748 to promote the formation of a vapor bubble that is smaller than the cross-sectional area of the channel (e.g., the horizontal channel 1740). For example, the recess 1782 may have an opening that is no more than half of the transverse dimension (such as the channel width or height) of the channel such that the vapor bubble that forms in the recess 1782 is smaller than the channel area. In other examples, the opening is no more than ⅓ of the transverse dimension of the channel.

A protrusion 1784 may be located on the interior surface 1748 to promote the promote the formation of and/or release of vapor bubbles on the interior surface of the channels. In some embodiments, the protrusion 1784 is formed by three-dimensional printing on the interior surface 1748. In some embodiments, the protrusion 1784 is formed by etching or machine material to leave the protrusion 1784 remaining.

The BESF described herein may be combined in any manner. In some embodiments, the protrusion 1784 is located on a recess surface in the recess 1782. In some embodiments, the protrusion 1784 has a BEC 1780 located thereon. In some embodiments, the recess 1782 has a BEC 1780 positioned therein.

Figure 21:
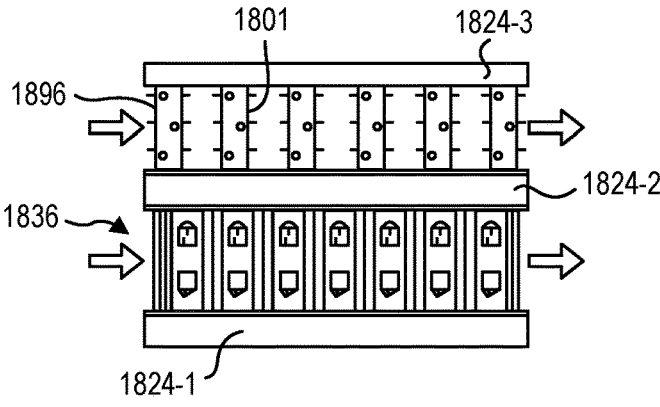
FIG. 21 is a side view of a stacked-die processor with a wicking heat spreader and pin fins with boiling enhancement surface features, according to at least one embodiment of the present disclosure.

FIG. 21 is a side view of another embodiment of a stacked-die processor with a wicking heat spreader 1836 located between the first die 1824-1 and a second die 1824-2 and a set of pin fins 1896 between the second die 1824-2 and the third die 1824-3. In some embodiments, the BESFs described herein may be used in any combination with the wicking heat spreaders and pin fins described herein. For example, the wicking heat spreader 1836 may be similar to that described in relation to FIG. 20, while the pin fins 1896 may have a BEC, a recess, a protrusion, or combinations thereof.

In some embodiments, the pin fins 1896 have BESFs on the pin surface 1801, such as a BEC, recess, protrusion, or combinations thereof, such as described in relation to FIG. 20. The BESFs may be positioned on all of the pin surface 1801 contacting the working fluid, or the BESFs may be positioned on less than all of the pin surface 1801. For example, the BESFs may increase drag on the working fluid, inhibiting flow of the working fluid through the microfluidic volume 1894. In some embodiments, the BESFs are selectively located on the pin surface 1801 relative to the direction of flow of the working fluid to promote the formation of and/or release of vapor bubbles (e.g., of the vapor phase of the working fluid) while lessening the drag on the flow of the working fluid.

INDUSTRIAL APPLICABILITY

The present disclosure relates generally to systems and methods for thermal management of electronic devices or other heat-generating components. In some embodiments, heat spreaders and wicking structures according to the present disclosure promote the boiling and vapor bubble formation and/or release during vaporization of working fluid.

Immersion chambers surround the heat-generating components in a liquid working fluid, which conducts heat from the heat-generating components to cool the heat-generating components. As the working fluid absorbs heat from the heat-generating components, the temperature of the working fluid increases. In some embodiments, the hot working fluid can be circulated through the thermal management system to cool the working fluid and/or replace the working fluid with cool working fluid. In some embodiments, the working fluid vaporizes, introducing vapor into the liquid of the working fluid which rises out of the liquid phase, carrying thermal energy away from the heat-generating components in the gas phase via the latent heat of boiling.

In large-scale computing centers, such as cloud-computing centers, data processing centers, data storage centers, or other computing facilities, immersion cooling systems provide an efficient method of thermal management for many computing components under a variety of operating loads. In some embodiments, an immersion cooling system includes a working fluid in an immersion chamber and a heat exchanger to cool the liquid phase and/or a condenser to extract heat from the vapor phase of the working fluid. The heat exchanger may include a condenser that condenses the vapor phase of the working fluid into a liquid phase and returns the liquid working fluid to the immersion chamber. In some embodiments, the liquid working fluid absorbs heat from the heat-generating components, and one or more fluid conduits direct the hot liquid working fluid outside of the immersion chamber to a radiator, heat exchanger, or region of lower temperature to cool the liquid working fluid.

In some embodiments, a high-compute application assigned to and/or executed on the computing devices or systems in the immersion cooling system requires a large amount of thermal management. A working fluid boiling absorbs heat to overcome the latent heat of boiling. The phase change from liquid to vapor, therefore, allows the working fluid to absorb a comparatively large amount of heat with a small associated increase in temperature. Further, the lower density allows the vapor to be removed from the immersion bath efficiently to exhaust the associated heat from the system.

In some embodiments, a thermal management system includes an immersion tank with a two-phase working fluid positioned therein. The two-phase working fluid receives heat from heat-generating components immersed in the liquid working fluid, and the heat vaporizes the working fluid, changing the working fluid from a liquid phase to a vapor phase. The thermal management system includes a condenser, such as described herein, to condense the vapor working fluid back into the liquid phase. In some embodiments, the condenser is in fluid communication with the immersion tank by one or more conduits. In some embodiments, the condenser is positioned inside the immersion tank.

In an example, a heat-generating component includes a die positioned on a printed circuit board (PCB). The die may be a generalized device, such as a central processing unit (CPU) or graphical processing unit (GPU), or a specialized device application-specific integrating circuit (ASIC). The die generates heat during use. The heat is transmitted by a thermal interface material (TIM) to a heat spreader that is in contact with the liquid phase of the working fluid in the immersion chamber.

The heat spreader transfers heat to the liquid phase of the working fluid to vaporize the working fluid into a vapor phase of the working fluid. As described herein, the formation of the vapor bubbles allows the working fluid to receive heat to overcome the latent heat of vaporization without substantially increasing the temperature of the working fluid. The vapor bubbles then, through the buoyancy of the vapor phase, rise out of the liquid phase of the working fluid, and liquid phase of the working fluid replaces the vapor phase contacting the surface of the heat spreader, allowing the process to repeat and continue.

However, the heat transfer of the heat spreader to the liquid phase of the working fluid is limited by the surface area of the heat spreader in contact with the liquid phase of the working fluid. A conventional, solid heat spreader has a limited surface area given the amount of space on the PCB and/or in the immersion chamber relative to other components, devices, or structures immersed in the working fluid. In some embodiments, vapor formation on the surface of the heat spreader further limits the available surface area of the heat spreader in contact with the liquid phase of the working fluid. A heat transfer rate from the heat spreader to the vapor phase of the working fluid is lower than for the heat spreader to the liquid phase of the working fluid. For example, while the vapor bubble remains in contact with a surface of the heat spreader, such as due to cohesion, the heat spreader can continue to increase in temperature above the boiling temperature of the working fluid, which may be undesirable for thermal management of the heat-generating component and/or preventing dryout in the immersion cooling system.

In some embodiments, one or more features that increase surface area and promote bubble formation and release from the heat spreader can improve heat transfer rates from the heat spreader to the working fluid.

In some embodiments, the wicking heat spreader is a three-dimensional heat spreader with a plurality of channels therein or therethrough that allow flow of working fluid through an interior volume of the heat spreader. A three-dimensional heat spreader conducts heat within a plane of the heat spreader that is parallel to a plane of the heat source (such as a surface of a die), as well as in a vertical direction away from the plane. In some embodiments, the wicking heat spreader includes both horizontal channels and vertical channels. For example, the horizontal channels may draw a liquid phase of the working fluid into the wicking heat spreader from the sides of the wicking heat spreader, while vertical channels allow exhausting of both liquid phase and vapor phase working fluid from the wicking heat spreader.

In some embodiments, the vapor bubbles floating out of the channels of the wicking heat spreader contribute to the flow of liquid phase working fluid into the channels of the wicking heat spreader. For example, the bubbles vacating the space in the channels of the wicking heat spreader can draw liquid phase working fluid into the channels to replace the volume of the vapor bubbles. In some embodiments, the fluidic drag of the vapor bubbles moving through the liquid phase working fluid can drag the liquid phase in the direction of movement of the vapor bubbles, which may move hot liquid phase working fluid out of the wicking heat spreader and encourage cool liquid phase working fluid to enter the wicking heat spreader.

It should be understood that while some embodiments of a wicking heat spreader are described with horizontal and vertical channels, the wicking heat spreader may be oriented in any direction relative to gravity. The embodiments described herein will describe the horizontal channels as being oriented substantially parallel to a plane of a surface of the die and vertical channels as being oriented substantially perpendicular to the plane of a surface of the die, but the channels may have other orientations, as well, as will be described in greater detail herein.

In some embodiments, a wicking heat spreader has an outer surface. The outer surface has openings therein to allow ingress and egress of working fluid to an interior volume of the wicking heat spreader. The wicking heat spreader has at least one horizontal channel and at least one vertical channel with interior surfaces that are oriented toward the interior volume (e.g., toward the channels) and away from the outer surface of the wicking heat spreader. The interior surfaces and outer surfaces of the wicking heat spreader increase the surface area of the wicking heat spreader relative to a conventional heat spreader with a continuous outer surface and no working fluid flow through the frame of the heat spreader. Increased surface area relative to volume allows for greater heat transfer to the working fluid and greater thermal management capacity.

In some embodiments, the interior surfaces have at least one boiling enhancement surface feature (BESF) thereon. For example, the BESF may include one or more surface treatments, recesses, or protrusions on the interior surfaces that promote the formation of vapor bubbles on and/or the release of vapor bubbles from the interior surfaces. In some embodiments, the BESF is or includes a boiling enhancement coating (BEC) applied to the interior surface of the wicking heat spreader. For example, the wicking heat spreader may have a frame with channels therein, and the BEC may be applied to the surface(s) of the frame such that the BEC is located on at least one interior surface 448 of the frame. In some embodiments, the BEC is located on at least 50% of the interior surface area of the frame. In some embodiments, the BEC is located on substantially all of the interior surface area of the frame. In some embodiments, the BEC is located on substantially all of the surface area of the frame in contact with or configured to contact working fluid (i.e., outer surfaces and interior surfaces).

In some embodiments, the wicking heat spreader is thermally connected to a heat-generating component through an intermediate heat spreader. For example, some heat spreaders, such as vapor chambers or graphite sheets have high in-plane thermal conductive to spread heat laterally, but such planar heat spreaders may have comparatively low surface area to volume ratios to efficiently transfer heat to the working fluid.

In some embodiments, the intermediate heat spreader receives heat from the die or other portion of a heat-generating component through a first TIM, and the intermediate heat spreader provides lateral heat spreading within a plane of the intermediate heat spreader. The intermediate heat spreader then allows the heat to be transferred more or substantially uniformly to the wicking heat spreader through a second TIM.

In some embodiments, the wicking heat spreader includes a plurality of horizontal rails with horizontal channels therebetween and a plurality of vertical rails with vertical channels therebetween.

In some embodiments, the horizontal channels allow for intakes to the horizontal channels on the lateral sides of the wicking heat spreader. The horizontal channels connect to vertical channels to flow working fluid through the wicking heat spreader. The working fluid can then exhaust from the wicking heat spreader.

In some embodiments, at least one of the horizontal channels is straight and continuous from a front surface (e.g., a lateral side) to a rear surface (e.g., a lateral side opposite the front surface). In some embodiments, all of the horizontal channels between the front surface and the rear surface are straight and continuous. In some embodiments, at least one of the horizontal channels has a curve, a bend, a corner, or another deviation that causes fluid flow to change direction compared to a straight channel. In some embodiments, at least one of the horizontal channels terminates between a first lateral side and a second lateral side.

In some embodiments, at least one of the horizontal channels allows fluid flow from a front surface of the wicking structure to a rear surface of the wicking structure. In some embodiments, at least one of the horizontal channels terminates between a first lateral side and a second lateral side and/or exhausts out a top surface of the wicking heat spreader.

In some embodiments, at least one of the vertical channels is straight and continuous from a bottom surface to the top surface. In some embodiments, all of the vertical channels between the bottom surface and the top surface are straight and continuous. In some embodiments, at least one of the vertical channels has a curve, a bend, a corner, or another deviation that causes fluid flow to change direction compared to a straight channel. In some embodiments, at least one of the vertical channels terminates between a bottom surface and the top surface.

In some embodiments, at least one of the vertical channels allows fluid flow from a bottom surface and the top surface. In some embodiments, at least one of the vertical channels terminates between a bottom surface and the top surface and/or exhausts out a lateral side of the wicking heat spreader.

The wicking heat spreader has a plurality of horizontal channels with intakes on the lateral side. In some embodiments, the horizontal channels have uniform transverse dimension (e.g., perpendicular to a direction of flow through the horizontal channel) such as a channel width or channel height. In other embodiments, at least one horizontal channel has a transverse area (e.g., channel width by channel height) that changes along a length of the horizontal channel. For example, vapor bubbles forming in the horizontal channel may create a pressure in the wicking heat spreader that resists ingress of additional working fluid. In some embodiments, the horizontal channel may increase in cross-sectional area toward a center of the wicking heat spreader to accommodate the increase in volume of the working fluid upon vaporization.

The wicking heat spreader has a plurality of vertical channels with openings on the top surface. In some embodiments, the vertical channels have uniform transverse dimension (e.g., perpendicular to a direction of flow through the vertical channels) such as a channel width or channel height illustrated in relation to the horizontal channels. In other embodiments, at least one vertical channel has a transverse area that changes along a length of the vertical channel toward the top surface. For example, vapor bubbles forming in the vertical channel may create a pressure in the wicking heat spreader that resists ingress of additional working fluid. In some embodiments, the vertical channel may increase in cross-sectional area toward the top surface of the wicking heat spreader to accommodate the increase in volume of the working fluid upon vaporization.

In some embodiments, the wicking heat spreader has a plurality of horizontal rails. In some embodiments, the horizontal rails have uniform transverse dimension (e.g., perpendicular to a direction of flow through the horizontal channel) such as a rail width or rail height. In other embodiments, at least one horizontal rail has a transverse area (e.g., rail width by channel height) that changes along a length of the horizontal rail. For example, vapor bubbles forming in the horizontal channel may create a pressure in the wicking heat spreader that resists ingress of additional working fluid. In some embodiments, one or more horizontal rails may decrease (e.g., taper) in cross-sectional area to allow the horizontal channel to increase in cross-sectional area toward a center of the wicking heat spreader to accommodate the increase in volume of the working fluid upon vaporization.

In some embodiments, the wicking heat spreader has a plurality of vertical rails. In some embodiments, the vertical rails have uniform transverse dimension (e.g., perpendicular to a direction of flow through the vertical channel) such as analog to the rail width or rail height described in relation to the horizontal rails. In other embodiments, at least one vertical rail has a transverse area that changes along a length of the vertical rail. For example, vapor bubbles forming in the vertical channel may create a pressure in the wicking heat spreader that resists ingress of additional working fluid. In some embodiments, one or more vertical rails may decrease (e.g., taper) in cross-sectional area toward the top surface to allow the horizontal channel to increase in cross-sectional area toward a center of the wicking heat spreader to accommodate the increase in volume of the working fluid upon vaporization.

To promote the formation of and/or release of vapor bubbles on the interior surface of the channels, in some embodiments, the channels include one of more BESF. In some embodiments, the BESF includes a BEC, a recess, a protrusion, or combinations thereof.

For example, a BEC may be deposited on an interior surface of a horizontal rail or a vertical rail of the wicking heat spreader. The BEC may be deposited by physical vapor deposition, chemical vapor deposition, sputtering, electroplating, or other coating deposition methods to create a surface roughness, texture, or chemical composition that promotes the formation of and/or release of vapor bubbles on the interior surface of the channels. In some embodiments, the BEC is etched into the interior surface of a horizontal rail or a vertical rail of the wicking heat spreader. For example, the BEC may be etched by ion etching or chemical etching to create a surface roughness or texture that promotes the formation of and/or release of vapor bubbles on the interior surface of the channels.

In some embodiments, the BESF includes or is a recess in the interior surface. The recess may include a curve or a corner. In some embodiments, the recess is positioned in the interior surface to promote the formation of a vapor bubble that is smaller than the cross-sectional area of the channel (e.g., the horizontal channel). For example, the recess may have an opening that is no more than half of the transverse dimension (such as the channel width or height) of the channel such that the vapor bubble that forms in the recess is smaller than the channel area. In other examples, the opening is no more than $\frac{1}{3}$ of the transverse dimension of the channel.

A protrusion may be located on the interior surface to promote the promote the formation of and/or release of vapor bubbles on the interior surface of the channels. In some embodiments, the protrusion is formed by three-dimensional printing on the interior surface. In some embodiments, the protrusion is formed by etching or machine material to leave the protrusion remaining.

The BESF described herein may be combined in any manner. In some embodiments, the protrusion is located on a recess surface in the recess. In some embodiments, the protrusion has a BEC located thereon. In some embodiments, the recess has a BEC positioned therein.

In some embodiments, a method of manufacturing a wicking heat spreader includes obtaining a frame of a wicking structure and forming at least one boiling enhancement surface feature positioned on at least one interior surface of the frame. In some embodiments, the frame includes at least one horizontal channel and at least one vertical channel that intersect and allow fluid flow therethrough.

In some embodiments, obtaining a frame includes machining the frame from a billet. In some embodiments, obtaining a frame includes three-dimensional printing of the frame. In some embodiments, obtaining a frame includes casting the frame. In some embodiments, obtaining a frame includes sintering of the frame. In some embodiments, obtaining a frame includes injection molding of the frame. In some embodiments, obtaining a frame includes a combination of machining, three-dimensional printing, casting, sintering, and injection molding. In some embodiments, obtaining a frame includes obtaining a first portion of the frame by any method described herein and subsequently additively manufacturing a second portion of the frame onto the first portion of the frame. For example, the first portion of the frame may have a BEC deposited thereon, and the second portion of the frame is additively manufactured over the first portion, thereby allowing an interior surface of the frame to have a BEC that would otherwise be inaccessible for some deposition techniques.

In some embodiments, forming at least one BESF on an interior surface of the frame includes depositing or etching a BEC on the interior surface. In some embodiments, forming at least one BESF on an interior surface of the frame includes forming a recess in the interior surface. In some embodiments, the recess is formed by etching. In some embodiments, the recess is formed by machining. In some embodiments, the recess is formed during three-dimensional printing of the frame. In some embodiments, forming at least one BESF on an interior surface of the frame includes forming a protrusion on the interior surface. In some embodiments, the protrusion is printed on the interior surface. In some embodiments, the protrusion is deposited on the interior surface. In at least one embodiment, the protrusion is formed in a recess of the interior surface.

A vapor bubble may form in a recess of the interior surface of the frame. In some embodiments, the recess includes protrusions. Liquid phase flow through the channels of the wicking heat spreader promotes the release of the vapor bubbles. In some embodiments, refilling of the vacated volume and/or release of the vapor bubble from frame can be increased by the use of a porous frame. For example, a porous frame may allow the liquid phase of the working fluid to enter the wicking heat spreader more easily and/or create a fluid pressure behind the vapor bubble to aid in releasing the vapor bubble.

In some embodiments, working fluid (either two-phase or single-phase working fluid) can be directed adjacent to and/or directly contacting a die in a heat-generating component. In some embodiments, a stacked die processor (e.g., a heat-generating component) includes a first die and a second die with a microfluidic volume therebetween. In some embodiments, the microfluidic volume allows flow of a liquid phase of a working fluid through the microfluidic volume and around a plurality of pin fins positioned between and connected to the first die and the second die. In some embodiments, the pin fins are integrally formed with one or both of the first die and the second die to allow direct on-chip cooling of the first die and the second die.

In some embodiments, the working fluid is a single-phase working fluid, and the liquid phase of the working fluid flows through the microfluidic volume from a first lateral side of the stacked-die processor to a second lateral side of the stacked die processor. In some embodiments, the first lateral side and second lateral side are opposite one another. In some embodiments, the lateral side and second lateral side are abutting one another at a corner of the stacked-die processor, such as allowing a 90° turn to the flow of working fluid through the microfluidic volume. In some embodiments, the top surface of the first die and the bottom surface of the second die are planar and parallel to one another such that a height of the microfluidic volume is constant through the microfluidic volume.

The pin fins connect the first die and the second die to one another and may provide thermal conductivity therebetween, such as conducting heat from the first die and the second die into the pin fins to assist in transferring the heat into the liquid phase of the working fluid. In some embodiments, at least one of the pin fins has a through-silicon via (TSV) positioned therein to provide electrically connection and communication through the pin fins between the electronic components and circuitry of the first die and the second die. In some embodiments, the TSV is vulnerable to thermal damage, and efficient removal of heat from the pin fin may increase the performance and/or operational lifetime of the TSVs and/or the stacked-die processor.

In some embodiments, the pin fins have BESFs on the pin surface, such as a BEC, recess, protrusion, or combinations thereof. The BESFs may be positioned on all of the pin surface contacting the working fluid, or the BESFs may be positioned on less than all of the pin surface. For example, the BESFs may increase drag on the working fluid, inhibiting flow of the working fluid through the microfluidic volume. In some embodiments, the BESFs are selectively located on the pin surface relative to the direction of flow of the working fluid to promote the formation of and/or release of vapor bubbles (e.g., of the vapor phase of the working fluid) while lessening the drag on the flow of the working fluid.

In some embodiments, a closed loop system for cooling a stacked-die heat generating component includes an inlet conduit connected to a first lateral side and an outlet conduit connected to a second lateral side. In other embodiments, the inlet conduit and outlet conduit connected to the same lateral side to circulate working fluid in the microfluidic volume.

In some embodiments, a stacked-die processor includes a first die, a second die, and a third die stacked with pin fins containing TSVs therebetween. In some embodiments, a first microfluidic volume is located between the first die and the second die, and a first set of pin fins couples the first die and the second die through the first microfluidic volume. In some embodiments, a second microfluidic volume is located between the second die and the third die, and a second set of pin fins couples the second die and the third die through the second microfluidic volume.

As described herein, the pin fins have, in some embodiments, at least one BESF position on a pin surface thereof. In some embodiments, the first set of pin fins and the second set of pin fins have the same BESF(s) thereon. For example, the first set of pin fins may have a BEC thereon and the second set of pin fins may have the same BEC thereon. In other examples, the first set of pin fins may have a plurality of recesses in a pin surface thereof, and the second set of pin fins may have a plurality of recesses in a pin surface thereof. In other examples, the first set of pin fins may have a plurality of protrusions on a pin surface thereof, and the second set of pin fins may have a plurality of protrusions on a pin surface thereof.

In some embodiments, the first set of pin fins and the second set of pin fins have different BESFs thereon. For example, the first set of pin fins may have a BEC thereon and the second set of pin fins may lack a BEC or have a different BEC thereon. In other examples, the first set of pin fins may have a plurality of recesses in a pin surface thereof, and the second set of pin fins may lack recesses in a pin surface thereof or have recesses in a different pattern or with different dimensions. In other examples, the first set of pin fins may have a plurality of protrusions on a pin surface thereof, and the second set of pin fins may lack protrusions on a pin surface thereof or have protrusions in a different pattern or with different dimensions. In some embodiments, the thermal management requires of the dies may be different, and the BESFs of the first set of pin fins and the second set of pin fins may be different to effect the different thermal management properties.

In some embodiments, the working fluid is urged through the first microfluidic volume and through the second microfluidic volume at the same flow rate. For example, a manifold connected to an inlet conduit may provide equal flow rate and/or equal fluid pressure to both the first microfluidic volume and the second microfluidic volume. In some embodiments, the flow rate is different, such as when different thermal management is required by different portions of the stacked-die processor. For example, a first inlet conduit may provide a first flow rate and/or fluid pressure to the first microfluidic volume and a second inlet conduit may provide a second flow rate and/or fluid pressure to the second microfluidic volume.

In some embodiments, the working fluid in the first microfluidic volume is the same working fluid in the second microfluidic volume. In some embodiments, the working fluid in the first microfluidic volume is shared with the second microfluidic volume. In other embodiments, a first working fluid is provided to the first microfluidic volume, and a second working fluid is provided to the second microfluidic volume. The first working fluid and second working fluid may have different boiling temperatures, different latent heat of boiling, different thermal capacities, different viscosities, or different reactivities, depending on different thermal management requirements of the different dies of the stacked-die processor.

While some embodiments described herein have a plurality of dies that are the same area, in other embodiments, at least one die of a stacked-die processor has a different shape or area than another die in the stacked-die processor. In some embodiments, a first die and second die (such as a CPU and GPU) have substantially the same area, while a third die (such as memory) has a different area. In some embodiments, different dies may have the same in-plane aspect ratio and have different areas, such as two different size squares. In some embodiments, different dies may have different in-plane aspect ratios and have the same area, such as two rectangles turned 90° relative to one another. In some embodiments, different dies may have different areas but share at least one dimension of their area, such as the second die and third die having different lengths in the direction of flow but having equal widths perpendicular to the direction of flow. In another example, the first die and the second die may have equal lengths in the direction of flow but having different widths perpendicular to the direction of flow.

Different size dies may have different thermal management requirements. In some embodiments, a first set of pin fins and a second set of pin fins have different BESFs thereon. For example, the first set of pin fins may have a BEC thereon and the second set of pin fins may lack a BEC or have a different BEC thereon. In other examples, the first set of pin fins may have a plurality of recesses in a pin surface thereof, and the second set of pin fins may lack recesses in a pin surface thereof or have recesses in a different pattern or with different dimensions. In other examples, the first set of pin fins may have a plurality of protrusions on a pin surface thereof, and the second set of pin fins may lack protrusions on a pin surface thereof or have protrusions in a different pattern or with different dimensions. In some embodiments, the thermal management requires of the dies may be different, and the BESFs of the first set of pin fins and the second set of pin fins may be different to effect the different thermal management properties.

In some embodiments, the working fluid is urged through the first microfluidic volume and through the second microfluidic volume at the same flow rate. For example, a manifold connected to an inlet conduit may provide equal flow rate and/or equal fluid pressure to both the first microfluidic volume and the second microfluidic volume. In some embodiments, the flow rate is different, such as when different thermal management is required by different portions of the stacked-die processor. For example, a first inlet conduit may provide a first flow rate and/or fluid pressure to the first microfluidic volume and a second inlet conduit may provide a second flow rate and/or fluid pressure to the second microfluidic volume.

In some embodiments, the working fluid in the first microfluidic volume is the same working fluid in the second microfluidic volume. In some embodiments, the working fluid in the first microfluidic volume is shared with the second microfluidic volume. In other embodiments, a first working fluid is provided to the first microfluidic volume, and a second working fluid is provided to the second microfluidic volume. The first working fluid and second working fluid may have different boiling temperatures, different latent heat of boiling, different thermal capacities, different viscosities, or different reactivities, depending on different thermal management requirements of the different dies of the stacked-die processor.

In some embodiments, the pin fin height can vary between sets of pin fins. For example, a first pin fin height of the first set of pin fins may be different from a second pin fin height of the second set of pin fins.

In some embodiments, a pin fin has a pin fin aspect ratio of the pin fin height to pin fin maximum transverse dimension. In some embodiments, a pin fin has a circular shape in transverse cross-section, and the pin fin maximum transverse dimension is a diameter of the pin fin. In some embodiments, a pin fin has a square shape in transverse cross-section, and the pin fin maximum transverse dimension is a diagonal dimension of the pin fin. In some embodiments, a pin fin has an oval shape in transverse cross-section, and the pin fin maximum transverse dimension is a major axis of the pin fin. In some embodiments, the maximum transverse dimension is no more than 100 micrometers. In some embodiments, the maximum transverse dimension is no more than 75 micrometers. In some embodiments, the maximum transverse dimension is no more than 50 micrometers.

In some embodiments, the pin fin aspect ratio is approximately 1.0. In some embodiments, the pin fin aspect ratio is greater than 1.0. In some embodiments, the pin fin aspect ratio is no more than 1.0. In some embodiments, the pin fin aspect ratio varies from one pin fin to another in a set of pin fins. For example, the pin fin aspect ratio may increase in a direction of flow of working fluid through the microfluidic volume. By decreasing the maximum transverse dimension of the pin fins in the direction of flow, there may be greater amounts of microfluidic volume between the pin fins as vapor bubble formation occupies a larger proportion of the microfluidic volume.

The pin fin aspect ratio is at least partially based on the number and diameter of TSVs in the pin fin. For example, a higher pin fin aspect ratio reduces the volume of the pin fin, allowing greater surface area-to-volume ratio and more efficient cooling by working fluid in the microfluidic volume. However, a higher pin fin aspect ratio also reduces the volume of the pin fin, limiting the quantity and/or size of the TSVs positioned therethrough, which may limit performance of the processor.

A volume ratio of the stacked-die processor is the amount of total volume of the microfluidic volume that is occupied by the pin fins. For example, a volume ratio of 1.0 means there is no microfluidic volume and the entire space between the first die and the second die is filled with silicon and/or TSVs. A volume ratio of 0.5 means that there is an equal amount of pin fins and microfluidic volume between the first die and the second die. In some embodiments, the volume ratio is no more than 0.9. In some embodiments, the volume ratio is no less than 0.5. In some embodiments, the volume ratio is approximately 0.75.

A pin fin may have any quantity of TSVs therethrough. In some embodiments, a pin fin has at least one TSV therethrough. In some embodiments, a pin fin has at least three TSVs therethrough. In some embodiments, a pin fin has at least 7 TSVs therethrough. In some embodiments, the TSVs of a pin fin are arranged in a square. In some embodiments, the TSVs of a pin fin are arranged in a hexagonal close-pack arrangement.

In some embodiments, a stacked-die processor includes a first set of pin fins with a first pin fin aspect ratio and a second set of pin fins with a second pin fin aspect ratio. In some embodiments, a stacked-die processor includes three dies with TSVs of varying sizes and aspect ratios in each set of pin fins.

In some embodiments, a flow of the liquid phase of the working fluid is controlled by a controller that is in data communication with a pump and one or more sensors, such as a flow meter, temperature gauge, or other sensors that measure operating conditions of the working fluid in the inlet conduit and/or the outlet conduit. The outlet conduit, in some embodiments, circulates the hot working fluid (which may include both liquid phase and vapor phase) to a condenser or heat exchanger.

In some embodiments, the controller is in data communication with the heat-generating component to receive operating metrics of the heat-generating component, such as clock frequency, core voltage, core temperature, power draw, etc. In some embodiments, a flow rate of the working fluid through the inlet conduit into the microfluidic volume is controlled by the controller based at least partially on the operating conditions of the working fluid in the inlet conduit and/or the outlet conduit and/or the operating metrics of the heat-generating components. The controller may adjust the flow rate of the working fluid by sending instructions to the fluid pump and/or to a valve or baffle in the conduits. In some embodiments, the flow rate of the working fluid from the fluid pump is less than 1.0 liters per minute. In some embodiments, the flow rate of the working fluid from the fluid pump is less than 0.5 liters per minute.

In some embodiments, a stacked-die processor includes a first die and a second die with a wicking heat spreader therebetween. The wicking heat spreader, such as any embodiment of a wicking heat spreader described herein, connects the first die and the second die. In some embodiments, at least a portion of the wicking heat spreader is integrally formed with silicon of one or more of the first die and the second die. In some embodiments, the wicking heat spreader is manufactured as a separate and discrete component, and the wicking heat spreader is affixed to one or both of the first die and the second die. For example, at least a portion of a vertical rail has one or more TSVs positioned therein, similar to the embodiments of pin fins described herein.

In some embodiments, a stacked-die processor has a wicking heat spreader with a plurality of BESFs positioned thereon. In some embodiments, the wicking heat spreader includes one or more BESFs located on an interior surface of the horizontal channels and vertical channels. In some embodiments, the BESFs include a BEC, a recess, a protrusion, or combinations thereof.

For example, a BEC may be deposited on an interior surface of a horizontal rail or a vertical rail of the wicking heat spreader. The BEC may be deposited by physical vapor deposition, chemical vapor deposition, sputtering, electroplating, or other coating deposition methods to create a surface roughness, texture, or chemical composition that promotes the formation of and/or release of vapor bubbles on the interior surface of the channels. In some embodiments, the BEC is etched into the interior surface of a horizontal rail or a vertical rail of the wicking heat spreader. For example, the BEC may be etched by ion etching or chemical etching to create a surface roughness or texture that promotes the formation of and/or release of vapor bubbles on the interior surface of the channels.

In some embodiments, the BESF includes or is a recess in the interior surface. The recess may include a curve or a corner. In some embodiments, the recess is positioned in the interior surface to promote the formation of a vapor bubble that is smaller than the cross-sectional area of the channel (e.g., the horizontal channel). For example, the recess may have an opening that is no more than half of the transverse dimension (such as the channel width or height) of the channel such that the vapor bubble that forms in the recess is smaller than the channel area. In other examples, the opening is no more than ⅓ of the transverse dimension of the channel.

A protrusion may be located on the interior surface to promote the promote the formation of and/or release of vapor bubbles on the interior surface of the channels. In some embodiments, the protrusion is formed by three-dimensional printing on the interior surface. In some embodiments, the protrusion is formed by etching or machine material to leave the protrusion remaining.

The BESF described herein may be combined in any manner. In some embodiments, the protrusion is located on a recess surface in the recess. In some embodiments, the protrusion has a BEC located thereon. In some embodiments, the recess has a BEC positioned therein.

In some embodiments, a stacked-die processor has a wicking heat spreader located between a first die and a second die and a set of pin fins between the second die and the third die. In some embodiments, the BESFs described herein may be used in any combination with the wicking heat spreaders and pin fins described herein. For example, the wicking heat spreader may be similar to that described herein, while the pin fins may have a BEC, a recess, a protrusion, or combinations thereof.

In some embodiments, the pin fins have BESFs on the pin surface, such as a BEC, recess, protrusion, or combinations thereof, such as described herein. The BESFs may be positioned on all of the pin surface contacting the working fluid, or the BESFs may be positioned on less than all of the pin surface. For example, the BESFs may increase drag on the working fluid, inhibiting flow of the working fluid through the microfluidic volume. In some embodiments, the BESFs are selectively located on the pin surface relative to the direction of flow of the working fluid to promote the formation of and/or release of vapor bubbles (e.g., of the vapor phase of the working fluid) while lessening the drag on the flow of the working fluid.

The present disclosure relates to systems and methods for cooling heat-generating components of a computer or computing device according to at least the examples provided in the sections below:

[A1] In some embodiments, a processor includes a first die, a second die connected to the first die with a microfluidic volume positioned between the first die and the second die, at least one pin fin positioned in the microfluidic volume, at least one through-silicon via (TSV) in the pin fin providing electrical connection between the first die and the second die, and a boiling enhancement surface feature positioned on a pin surface of the pin fin.

[A2] In some embodiments, the boiling enhancement surface feature of [A1] includes at least one protrusion on the pin surface of the at least one pin fin.

[A3] In some embodiments, the boiling enhancement surface feature of [A1] or [A2] includes at least one recess positioned in the pin surface of the at least one pin fin.

[A4] In some embodiments, the at least one recess of [A3] has a recess surface, and the recess surface has at least one protrusion on the recess surface.

[A5] In some embodiments, the boiling enhancement surface feature of any of [A1] through [A4] is a boiling enhancement coating positioned on the pin surface of the at least one pin fin.

[A6] In some embodiments, the processor of any of [A1] through [A5] includes a plurality of pin fins, and the at least one pin fin is a first pin fin of the plurality of pin fins, wherein the first pin fin has a first boiling enhancement surface feature positioned on the pin surface of the first pin fin and a second pin fin has a second boiling enhancement surface feature positioned on the pin surface of the second pin fin, wherein the first boiling enhancement surface feature is different from the second boiling enhancement surface feature.

[A7] In some embodiments, the processor of any of [A1] through [A5] includes a plurality of pin fins, and the at least one pin fin is a first pin fin of the plurality of pin fins, wherein the first pin fin has a first boiling enhancement surface feature positioned on the pin surface of the first pin fin and a second pin fin does not have a boiling enhancement surface feature positioned on the pin surface of the second pin fin.

[A8] In some embodiments, the at least one pin fin of any of [A1] through [A7] is circular in transverse cross-section.

[B1] In some embodiments, a processor includes a first die, a second die connected to the first die with a microfluidic volume positioned between the first die and the second die, at least one pin fin positioned in the microfluidic volume, at least one through-silicon via (TSV) in the pin fin providing electrical connection between the first die and the second die, and a boiling enhancement coating positioned on a pin surface of the pin fin.

[B2] In some embodiments, a top surface of the microfluidic volume of [B1] and a bottom surface of the microfluidic volume are planar and parallel.

[B3] In some embodiments, the at least one pin fin of [B1] or [B2] has a maximum transverse dimension of no more than 100 micrometers.

[B4] In some embodiments, the at least one pin fin of [B3] includes a plurality of TSVs therethrough.

[B5] In some embodiments, a pin fin aspect ratio of pin fin height to pin fin maximum transverse dimension of the at least one pin fin of any of [B1] through [B4] is no less than 1.0.

[B6] In some embodiments, a volume ratio of pin fin to microfluidic volume of the processor of any of [B1] through [B5] is no more than 0.9.

[B7] In some embodiments, the first die of any of [B1] through [B6] has a first area, and the second die has a second area different from the first area.

[B8] In some embodiments, the at least one pin fin of any of [B1] through [B7] includes a first pin fin and a second pin fin, wherein the first pin fin and second pin fin are different shapes.

[C1] In some embodiments, a system for cooling heat-generating components includes a first die, a second die connected to the first die with a microfluidic volume positioned between the first die and the second die, at least one pin fin positioned in the microfluidic volume, at least one through-silicon via (TSV) in the pin fin providing electrical connection between the first die and the second die, a boiling enhancement surface feature positioned on a pin surface of the pin fin, and a fluid pump configured to deliver a working fluid to the microfluidic volume.

[C2] In some embodiments, a manifold positioned around the microfluidic volume and at least partially defining a side wall of the microfluidic volume.

[C3] In some embodiments, the fluid pump of [C1] or [C2] provides the working fluid to the microfluidic volume with a flow rate of less than 1.0 liters per minute.

[C4] In some embodiments, the processor of any of [C1] through [C3] includes a third die connected to the second die with a second microfluidic volume positioned between the second die and the third die, at least one second pin fin positioned between in the second microfluidic volume, and at least one TSV in the second pin fin providing electrical communication between the second die and the third die.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about", "substantially", or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A processor comprising:
   a first die;
   a second die connected to the first die with a microfluidic volume positioned between the first die and the second die and contacting the first die and the second die;
   a plurality of pin fins positioned in fixed positions in the microfluidic volume connecting the first die to the second die, wherein a pin fin aspect ratio of pin fin height to pin fin maximum transverse dimension increases among the plurality of pin fins in a flow direction of the microfluidic volume; and
   a boiling enhancement surface feature positioned on a pin surface of each pin fin of the plurality of pin fins.

2. The processor of claim 1, wherein the boiling enhancement surface feature includes at least one protrusion on the pin surface.

3. The processor of claim 1, wherein the boiling enhancement surface feature includes at least one recess positioned in the pin surface of the at least one pin fin.

4. The processor of claim 3, wherein the at least one recess has a recess surface, and the recess surface has at least one protrusion on the recess surface.

5. The processor of claim 1, wherein the boiling enhancement surface feature is a boiling enhancement coating positioned on the pin surface of the at least one pin fin.

6. The processor of claim 1, further comprising a plurality of pin fins, and the at least one pin fin is a first pin fin of the plurality of pin fins, wherein the first pin fin has a first boiling enhancement surface feature positioned on the pin surface of the first pin fin and a second pin fin has a second boiling enhancement surface feature positioned on the pin surface of the second pin fin, wherein the first boiling enhancement surface feature is different from the second boiling enhancement surface feature.

7. The processor of claim 1, further comprising a plurality of pin fins, and the at least one pin fin is a first pin fin of the plurality of pin fins, wherein the first pin fin has a first boiling enhancement surface feature positioned on the pin surface of the first pin fin and a second pin fin does not have a boiling enhancement surface feature positioned on the pin surface of the second pin fin.

8. A processor comprising:
   a first die;
   a second die connected to the first die with a microfluidic volume positioned between the first die and the second die, wherein the microfluidic volume contacts the first die and the second die to transfer heat from the first die and from the second die to the microfluidic volume;
   a plurality of pin fins positioned in the microfluidic volume, wherein a pin fin aspect ratio of pin fin height to pin fin maximum transverse dimension increases among the plurality of pin fins in a flow direction of the microfluidic volume;

at least one through-silicon via (TSV) in at least one pin fin of the plurality of pin fins providing electrical connection between the first die and the second die; and a boiling enhancement coating positioned on a pin surface of each pin fin of the plurality of pin fins.

9. The processor of claim 8, wherein the second die defines a top surface of the microfluidic volume and the first die defines a bottom surface of the microfluidic volume, the top surface and the bottom surface being planar and parallel, and wherein the plurality of pin fins are thermally connected to the first die at the bottom surface and to the second die at the top surface, to transfer heat form the first die and from the second die to the microfluidic volume positioned between the first die and the second die.

10. The processor of claim 8, wherein each pin fin of the plurality of pin fins has a maximum transverse dimension of no more than 100 micrometers.

11. The processor of claim 10, wherein at least one pin fin of the plurality of pin fins includes a plurality of TSVs therethrough.

12. The processor of claim 8, wherein the pin fin aspect ratio of pin fin height to pin fin maximum transverse dimension is no less than 1.0.

13. The processor of claim 8, wherein a volume ratio of pin fin to microfluidic volume is no more than 0.9.

14. The processor of claim 8, wherein the first die has a first area, and the second die has a second area different from the first area.

15. The processor of claim 8, wherein the plurality of pin fins includes a first pin fin and a second pin fin, wherein the first pin fin and second pin fin are different shapes.

16. A system for cooling a heat-generating component, the system comprising a first die;

a second die connected to the first die with a microfluidic volume positioned between the first die and the second die, wherein the microfluidic volume contacts the first die and the second die to transfer heat from the first die and from the second die to the microfluidic volume; and a plurality of pin fins positioned in the microfluidic volume, wherein a pin fin aspect ratio of pin fin height to pin fin maximum transverse dimension increases among the plurality of pin fins in a flow direction of the microfluidic volume;

at least one through-silicon via (TSV) in at least one pin fin of the plurality of pin fins providing electrical connection between the first die and the second die;

a boiling enhancement surface feature positioned on a pin surface of each pin fin of the plurality of pin fins; and a fluid pump configured to deliver a working fluid to the microfluidic volume.

17. The system of claim 16, further comprising a manifold positioned around the microfluidic volume and at least partially defining a side wall of the microfluidic volume.

18. The system of claim 16, wherein the fluid pump provides the working fluid to the microfluidic volume with a flow rate of less than 1.0 liters per minute.

19. The system of claim 16, further comprising:

a third die connected to the second die with a second microfluidic volume positioned between the second die and the third die;

a second plurality of pin fins positioned between in the second microfluidic volume; and at least one TSV in at least one pin fin of the second plurality of pin fins providing electrical communication between the second die and the third die.

* * * * *